US010224368B2

(12) United States Patent
Li et al.

(10) Patent No.: US 10,224,368 B2
(45) Date of Patent: Mar. 5, 2019

(54) VOLTAGE-SWITCHED MAGNETO-RESISTIVE RANDOM ACCESS MEMORY (MRAM) EMPLOYING SEPARATE READ OPERATION CIRCUIT PATHS FROM A SHARED SPIN TORQUE WRITE OPERATION CIRCUIT PATH

(71) Applicant: QUALCOMM Incorporated, San Diego, CA (US)

(72) Inventors: Xia Li, San Diego, CA (US); Jimmy Jianan Kan, San Diego, CA (US); Seung Hyuk Kang, San Diego, CA (US); Bin Yang, San Diego, CA (US); Gengming Tao, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/639,099

(22) Filed: Jun. 30, 2017

(65) Prior Publication Data

US 2019/0006415 A1     Jan. 3, 2019

(51) Int. Cl.
*G11C 11/00* (2006.01)
*H01L 27/22* (2006.01)
(Continued)

(52) U.S. Cl.
CPC ........ *H01L 27/228* (2013.01); *G11C 11/1655* (2013.01); *H01L 43/02* (2013.01); *H01L 43/08* (2013.01)

(58) Field of Classification Search
CPC .... H01L 27/228; H01L 43/08; G11C 11/1655
(Continued)

(56) References Cited

U.S. PATENT DOCUMENTS 7,095,648 B2   8/2006 Ditewig et al.
7,238,540 B2   7/2007 Honjo et al.
(Continued)

FOREIGN PATENT DOCUMENTS

KR   20140113428 A   9/2014

OTHER PUBLICATIONS

Dierny, Bernard, "Spinelectronics: From Basic Phenomena to Magnetoresistive Memory (MRAM) Applications," MRAM IEDM tutorial, Dec. 3, 2016, 72 pages.
(Continued)

*Primary Examiner* — Connie Yoha
(74) *Attorney, Agent, or Firm* — W&T/Qualcomm

(57) ABSTRACT

Voltage-switched magneto-resistive random access memory (MRAM) employing separate read operation circuit paths from a shared spin torque write operation circuit path is disclosed. The MRAM includes an MRAM array that includes MRAM bit cell rows each including a plurality of MRAM bit cells. MRAM bit cells on an MRAM bit cell row share a common electrode to provide a shared write operation circuit path for write operations. Dedicated read operation circuit paths are also provided for each MRAM bit cell separate from the write operation circuit path. As a result, the read operation circuit paths for the MRAM bit cells do not vary as a result of the different layout locations of the MRAM bit cells with respect to the common electrode. Thus, the read parasitic resistances of the MRAM bit cells do not vary from each other because of their different coupling locations to the common electrode.

30 Claims, 21 Drawing Sheets

(51) Int. Cl.
*H01L 43/08* (2006.01)
*H01L 43/02* (2006.01)
*G11C 11/16* (2006.01)

(58) Field of Classification Search
USPC .................................. 365/158, 171, 189.19
See application file for complete search history.

(56) References Cited

U.S. PATENT DOCUMENTS

| | | | |
|---|---|---|---|
| 7,359,235 B2 | 4/2008 | Katti | |
| 8,553,449 B2 | 10/2013 | Liu et al. | |
| 8,711,608 B2 | 4/2014 | Xi et al. | |
| 9,799,386 B1* | 10/2017 | DeBrosse | G11C 11/1675 |
| 2004/0160809 A1* | 8/2004 | Lin | G11C 11/16 365/158 |
| 2009/0086531 A1* | 4/2009 | Yang | G11C 11/16 365/158 |
| 2010/0054026 A1* | 3/2010 | Xi | G11C 11/16 365/158 |
| 2013/0070520 A1 | 3/2013 | El et al. | |
| 2017/0169872 A1 | 6/2017 | Yoda et al. | |

OTHER PUBLICATIONS

Fan, Xin et al., "Quantifying interface and bulk contributions to spin-orbit torque in magnetic bilayers," Nature Communications, vol. 5, Jan. 9, 2014, 8 pages.
Kim, Junyeon et al., "Anomalous temperature dependence of current induced torques in CoFeB|MgO heterostructures with Ta based underlayers," arXiv preprint arXiv:1402.6388, Feb. 26, 2014, 35 pages.
Liu, Luqiao et al., "Spin torque switching with the giant spin Hall effect of tantalum," arXiv preprint arXiv:1203.2875, Mar. 13, 2012, 31 pages.
Liu, Luqiao et al., "Spin-Torque Switching with the Giant Spin Hall Effect of Tantalum," Science, vol. 336, May 4, 2012, pp. 555-558.
Kazemi, Mohammad, "All-Spin-Orbit Switching of Perpendicular Magnetization," IEEE Transactions on Electron Devices, vol. 63, No. 11, Nov. 2016, pp. 4499-4505.
Yoda, H. et al., "Voltage-Control Spintronics Memory (VoCSM) Having Potentials of Ultra-Low Energy-Consumption and High-Density," IEEE International Electron Devices Meeting (IEDM)2016, IEDM16-679, IEEE, Dec. 2016, pp. 27.6.1-27.6.4.
International Search Report and Written Opinion—PCT/US2018/039910—ISA/EPO—dated Oct. 18, 2018.

* cited by examiner

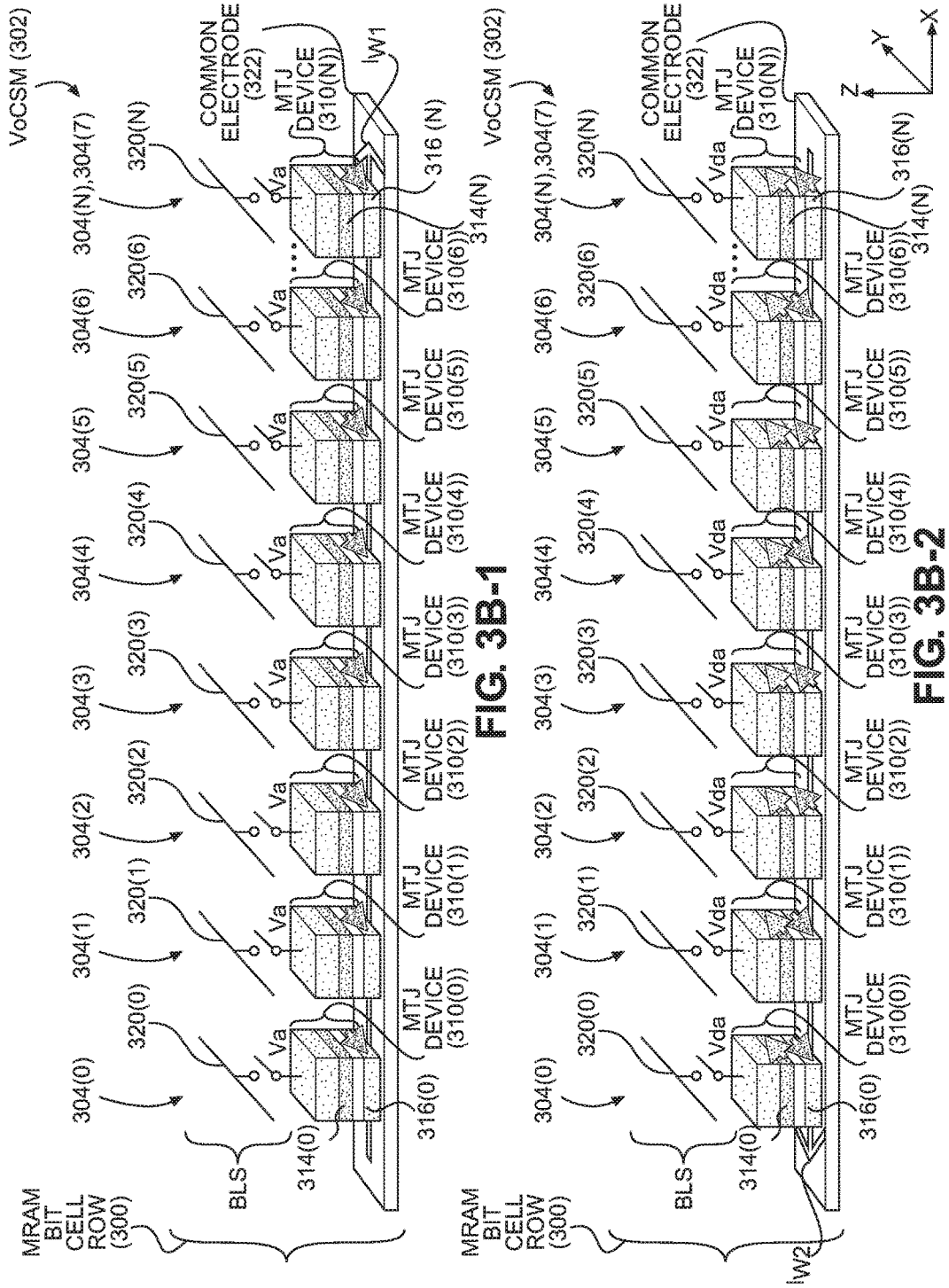

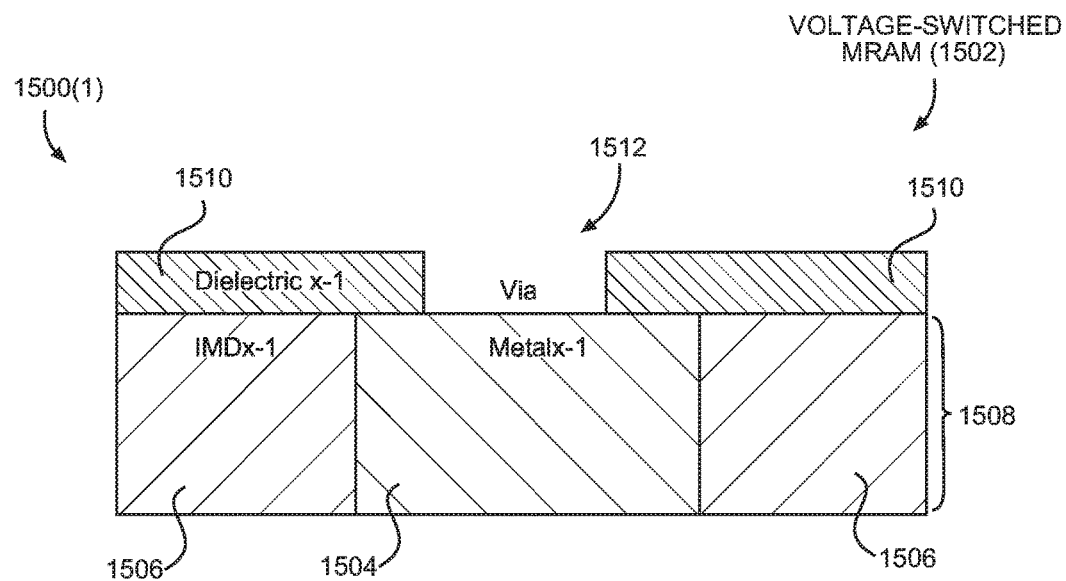
FIG. 15A
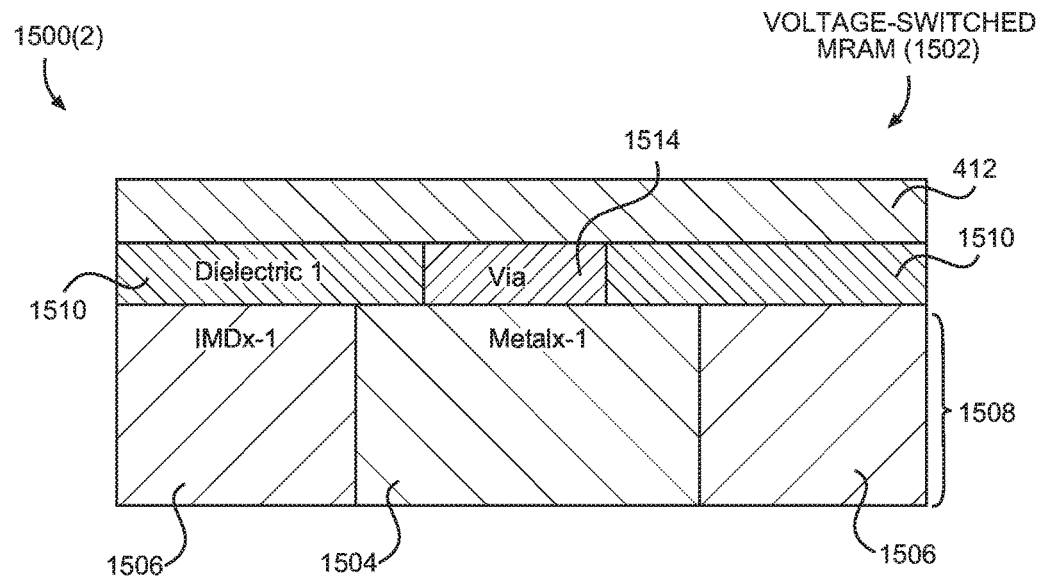
FIG. 15B
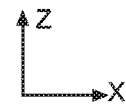

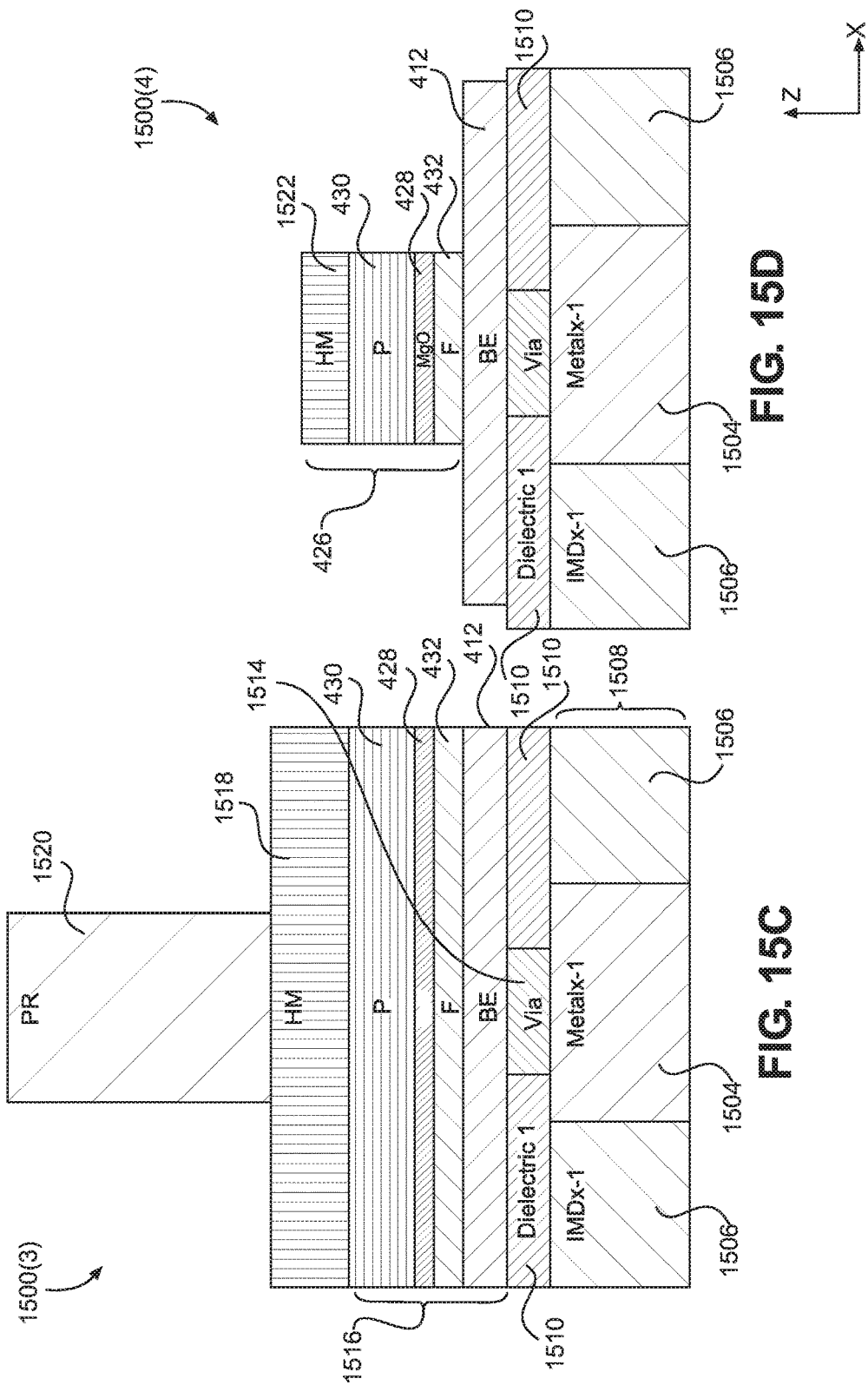

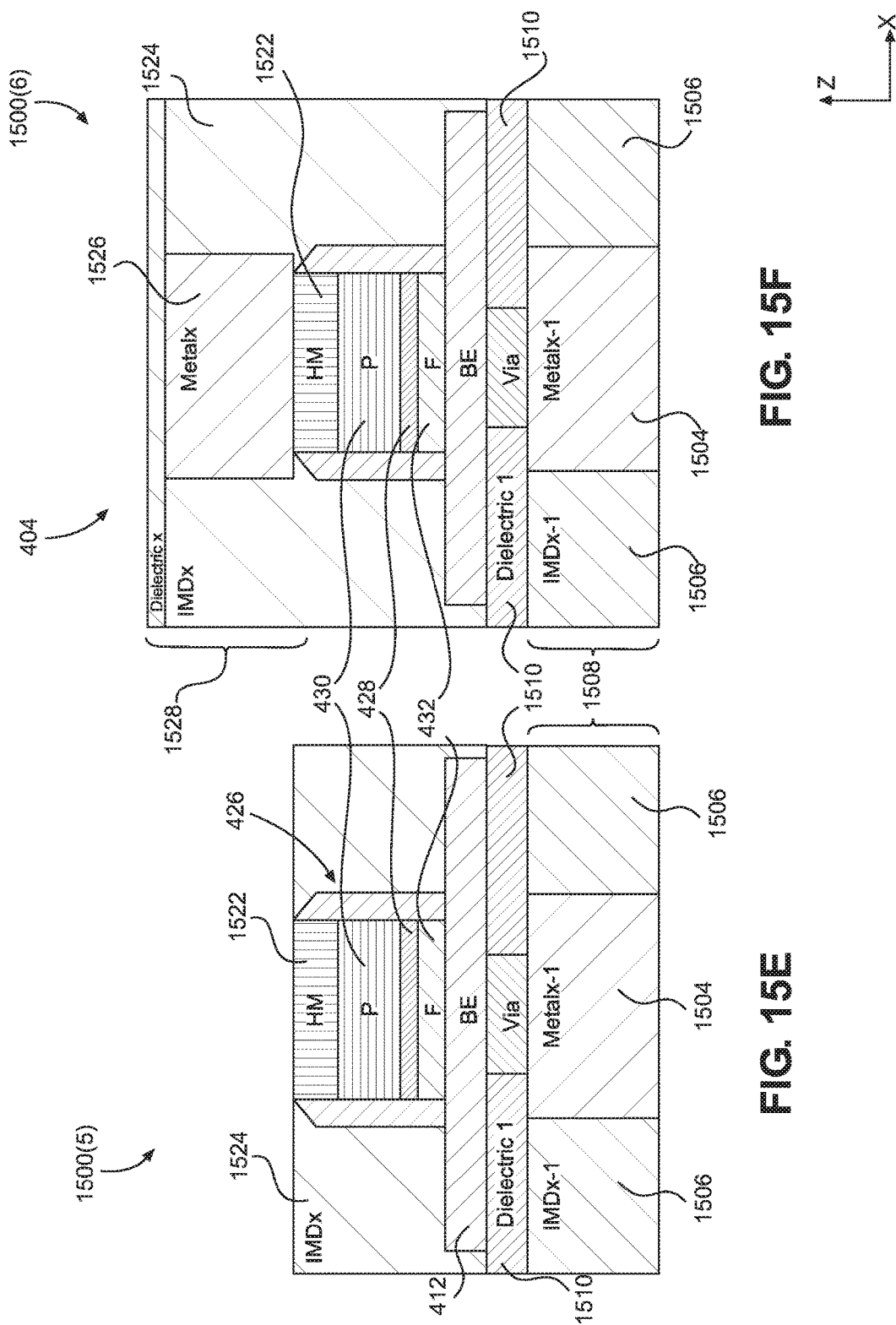

VOLTAGE-SWITCHED MAGNETO-RESISTIVE RANDOM ACCESS MEMORY (MRAM) EMPLOYING SEPARATE READ OPERATION CIRCUIT PATHS FROM A SHARED SPIN TORQUE WRITE OPERATION CIRCUIT PATH

BACKGROUND

I. Field of the Disclosure

The technology of the disclosure relates generally to magneto-resistive random access memory (MRAM), and more particularly to MRAM employing spin torque magnetic tunnel junction (MTJ) devices in MRAM bit cells.

II. Background

Semiconductor storage devices are used in integrated circuits (ICs) in electronic devices to provide data storage. One example of a semiconductor storage device is magneto-resistive random access memory (MRAM). MRAM is non-volatile memory in which data is stored by programming a magnetic tunnel junction (MTJ) as part of an MRAM bit cell. One advantage of MRAM is that MTJs in MRAM bit cells can retain stored information even when power is turned off. This is because data is stored in the MTJ as a small magnetic element rather than as an electric charge or current.

In this regard, an MTJ comprises a free ferromagnetic layer ("free layer") disposed above or below a fixed or pinned ferromagnetic layer ("pinned layer"). The free and pinned layers are separated by a tunnel junction or barrier formed by a thin non-magnetic dielectric layer. The magnetic orientation (i.e., the magnetic moment direction) of the free layer can be changed, but the magnetic orientation of the pinned layer remains fixed or "pinned." Data can be stored in the MTJ according to the magnetic orientation between the free and pinned layers. When the magnetic orientations of the free and pinned layers are anti-parallel (AP) to each other, a first memory state exists (e.g., a logical '1'). When the magnetic orientations of the free and pinned layers are parallel (P) to each other, a second memory state exists (e.g., a logical '0'). The magnetic orientations of the free and pinned layers can be sensed to read data stored in the MTJ by sensing a resistance when current flows through the MTJ. Data can also be written and stored in the MTJ by applying a magnetic field to change the orientation of the free layer to either a P or AP magnetic orientation with respect to the pinned layer.

Recent developments in MTJ devices involve spin-transfer torque (STT)-MTJ devices. In STT-MTJ devices, the spin polarization of carrier electrons, rather than a pulse of a magnetic field, is used to program the state stored in the MTJ (i.e., a '0' or a '1'). FIG. 1 illustrates an STT-MTJ device 100 (hereinafter "MTJ device 100"). The MTJ device 100 is provided as part of an MRAM bit cell 102 to store non-volatile data. A metal-oxide semiconductor (MOS) (typically n-type MOS, i.e., NMOS) access transistor 104 is provided to control reading and writing to the MTJ device 100. A drain (D) of the access transistor 104 is coupled to a bottom electrode 106 of the MTJ device 100, which is coupled to a pinned layer 108 for example. A word line (WL) is coupled to a gate (G) of the access transistor 104. A source (S) of the access transistor 104 is coupled to a voltage source ($V_S$) through a source line (SL). The voltage source ($V_S$) provides a source line voltage ($V_{SL}$) on the source line (SL).

A bit line (BL) is coupled to a top electrode 110 of the MTJ device 100, which is coupled to a free layer 112 for example. The pinned layer 108 and the free layer 112 are separated by a tunnel barrier 114.

With continuing reference to FIG. 1, when writing data to the MTJ device 100, the gate (G) of the access transistor 104 is activated by activating the word line (WL). A bit line voltage ($V_{BL}$) pulse is applied on the bit line (BL) and a source line voltage ($V_{SL}$) is applied on the source line (SL) to control a voltage differential across the MTJ device 100. As a result, a write current (I) is generated between the drain (D) and the source (S) of the access transistor 104. The direction of the write current (I) is based on whether the voltage differential between the bit line voltage ($V_{BL}$) and the source line voltage ($V_{SL}$) is a positive or negative voltage. If the magnetic orientation of the MTJ device 100 in FIG. 1 is to be changed from AP to P, the bit line voltage ($V_{BL}$) and the source line voltage ($V_{SL}$) are controlled to provide a positive voltage from the bit line (BL) to the source line (SL) so that a write current ($I_{AP-P}$) flows from the free layer 112 to the pinned layer 108. This induces a STT at the free layer 112 to change the magnetic orientation of the free layer 112 to P with respect to the pinned layer 108. If the magnetic orientation of the MTJ device 100 in FIG. 1 is to be changed from P to AP, the bit line voltage ($V_{BL}$) and the source line voltage ($V_{SL}$) are controlled to provide a negative voltage from the bit line (BL) to the source line (SL) so that a write current ($I_{P-AP}$) flows from the pinned layer 108 to the free layer 112. This induces a STT at the free layer 112 to change the magnetic orientation of the free layer 112 to AP with respect to the pinned layer 108.

FIG. 2 is a schematic diagram of an exemplary MRAM system 200 that includes an MRAM array 202 employing MRAM bit cells 102(0)(0)-102(M)(N) like the MRAM bit cell 102 in FIG. 1. The MRAM array 202 is organized as having 'N+1' MRAM bit cell columns 0-N and 'M+1' MRAM bit cell rows 0-M of MRAM bit cells 102(0)(0)-102(M)(N) supporting an "N+1" bit wide data word. For any given MRAM bit cell row 0-M in the MRAM array 202, each MRAM bit cell column 0-N of the MRAM array 202 includes an MRAM bit cell 102 in which a single data value or bit is stored representing either a logical '0' or logical '1' value.

A read operation to an MRAM bit cell 102(0)(0)-102(M)(N) is performed by a read voltage $V_r$ being applied to a BL input/output (I/O) 204 and generating a read enable signal on a read enable line 206 coupled to both a bit line (BL) column multiplexor (Mux) circuit 208 and a source line (SL) column mux circuit 210. The BL column mux circuit 208 switches the read voltage $V_r$ to a respective bit line $BL_0$-$BL_N$ to the MRAM bit cell column 0-N containing the MRAM bit cell 102 to be read based on a memory address (Addr) of the read operation. Similarly, the SL column mux circuit 210 selects a respective source line $SL_0$-$SL_N$ based on the memory address (Addr) for the read operation. To then select a particular MRAM bit cell 102(0)(0)-102(M)(N) to be read, a respective word line $WL_0$-$WL_m$ is also activated based on the memory address to activate access transistors 104(0)(0)-104(M)(N) in selected MRAM bit cell row 0-M to be read. In this manner, a read circuit path is formed between the selected source line $SL_0$-$SL_N$ and a selected MTJ device 100(0)(0)-100(M)(N) according to the memory address for the read operation. The read voltage $V_r$ applied to the selected MRAM bit cell 102(0)(0)-102(M)(N) causes a read current $I_r$ to flow through the MTJ device 100(0)(0)-100(M)(N) of the selected MRAM bit cell 102(0)(0)-102(M)(N) according to the memory address (Addr) to a SL I/O 212.

The read current $I_r$ is sensed by a sense amplifier 214 coupled to the SL I/O 212 to determine if a logical '0' or logical '1' is stored in the selected MRAM bit cell 102(0) (0)-102(M)(N) according to the resistance of the selected MRAM bit cell 102(0)(0)-102(M)(N). As discussed above, the resistance of an MRAM bit cell 102(0)(0)-102(M)(N) is a function of whether its MTJ device 100(0)(0)-100(M)(N) is in a P or AP state.

With continuing reference to FIG. 2, a write operation to an MRAM bit cell 102(0)(0)-102(M)(N) is performed generating a write enable signal WE on a write enable line 216 coupled to both the BL column mux circuit 208 and the SL column mux circuit 210. A first write voltage $V_{BL}$ (e.g., in the form of a voltage pulse) is applied to the BL I/O 204 and a second write voltage $V_{SL}$ applied to the SL I/O 212. The BL column mux circuit 208 switches the first write voltage $V_{BL}$ to a respective bit line $BL_0$-$BL_N$ to the MRAM bit cell column 0-N containing the MRAM bit cell 102 to be written based on the memory address (Addr) of the write operation. Similarly, the BL column mux circuit 208 switches the second write voltage $V_{SL}$ to a respective bit line $BL_0$-$BL_N$ to the MRAM bit cell column 0-N containing the MRAM bit cell 102 to be written based on the memory address (Addr) of the write operation. To then select a particular MRAM bit cell 102(0)(0)-102(M)(N) to be read, a respective word line $WL_0$-$WL_m$ is also activated based on the memory address to activate the access transistors 104(0)( )-104(M)( ) in the selected MRAM bit cell row 0-M to be read. In this manner, a write circuit path is formed between the selected source line $SL_0$-$SL_N$ and the selected MTJ device 100(0)(0)-100 (M)(N) according to the memory address for the write operation. Similar to FIG. 1, the bit line and source line write voltages $V_{BL}$, $V_{SL}$ can be controlled to control whether a positive or negative voltage differential exists between the selected bit line $BL_0$-$BL_N$ and the selected source line $SL_0$-$SL_N$. The voltage differential generates a write current $I_w$ flowing through the MTJ device 100(0)(0)-100(M)(N) of the selected MRAM bit cell 102(0)(0)-102(M)(N) according to the memory address (Addr) to switch the magnetic orientation of the free layer 112 of the MTJ device 100 of the selected MRAM bit cell 102(0)(0)-102(M)(N). This induces a STT at the free layer 112 of the selected MRAM bit cell 102(0)(0)-102(M)(N). To switch the magnetic orientation of the free layer 112 to either a P or AP state based on whether the voltage differential between the selected bit line $BL_0$-$BL_N$ and the selected source line $SL_0$-$SL_N$ is a positive or negative voltage. For a write operation, the bit line and source line voltages $V_{BL}$, $V_{SL}$ are controlled so that a sufficient high write current $I_w$ is generated to be able to switch the magnetic orientation of the free layer 112 of the selected MRAM bit cell 102(0)(0)-102(M)(N).

As shown in FIG. 2, an access transistor 104(0)(0)-104 (M)(N) is provided in each respective MRAM bit cell 102(0)(0)-102(M)(N) to create a circuit path between a selected bit line $BL_0$-$BL_N$ and a selected source line $SL_0$-$SL_N$ for read and write operations. Thus, the density of the MTJs 100(0)(0)-100(M)(N) provided in the MRAM array 202 is affected by the size and density of access transistors 104(0)(0)-104(M)(N). It may be desired to increase the density of MRAM bit cell 102(0)(0)-102(M)(N) in the MRAM array 202. However, the access transistors 104(0) (0)-104(M)(N) need to be sized large enough to have a sufficient drive strength to enable a sufficiently high write current $I_w$ to flow through the MTJ device 100(0)(0)-100 (M)(N) of the selected MRAM bit cell 102(0)(0)-102(M)(N) for a write operation. Thus, the access transistors 104(0)(0)- 104(M)(N) and their respective sizes of the MRAM bit cell 102(0)(0)-102(M)(N) are a controlling factor in the achievable density of MRAM bit cells 102(0)(0)-102(M)(N) provided in the MRAM array 202.

SUMMARY OF THE DISCLOSURE

Aspects disclosed in the detailed description include voltage-switched magneto-resistive random access memory (MRAM) employing separate read operation circuit paths from a shared spin torque write operation circuit path. In exemplary aspects disclosed herein, the MRAM includes an MRAM array that includes one or more MRAM bit cell rows that each include a plurality of MRAM bit cells. Each MRAM bit cell includes a magnetic tunnel junction (MTJ) device that is configured to either be in a parallel (P) or anti-parallel (AP) magnetization state to store representations of a logical '0' and '1' for providing memory storage. MRAM bit cells on an MRAM bit cell row share a common electrode (e.g., top or bottom electrode) to provide a shared write operation circuit path. Two write operation transistors coupled to each end portion of the common electrode are activated in response to a write operation to form a write circuit path for write current to flow between the write operation transistors. The write operation transistors are controlled to control direction of the write current through the common electrode, which controls the direction of spin torque applied to the respective MTJ device of the MTJ bit cells. To write data to selected MRAM bit cells in the MRAM bit cell row, a negative voltage is applied to each non-shared electrode of the MRAM bit cells to be written to lower the energy barrier of its respective MTJ device with the spin torque applied as a result of current flowing through the common electrode to switch the magnetic orientation (i.e., magnetic moment direction) of the MTJ devices to be written. In this manner, a write operation transistor is not required for each MRAM bit cell such that density of the MRAM bit cells is controlled by the layout of the write operation transistors. Further, by lowering the energy barrier of MTJ devices of the MRAM bit cells to be written in a write operation, less energy is required to write data to the MRAM bit cells. However, for read operations, if the common electrode also forms the read operation circuit path for carrying read current generated as a result of applying a read voltage to an MRAM bit cell to be read, the read operation circuit path will vary based on which MRAM bit cell is being written, thus varying read parasitic resistance resulting from the common electrode of the MRAM bit cells. This is because the MTJ devices of each MRAM bit cell are located along different portions of the common electrode, and thus located different distances from the write operation transistors. Read parasitic resistance affects the tunnel magnetoresistance (TMR) ratio of an MTJ device, thus affecting the read window. Further, the common electrode may increase read parasitic resistance over conventional MRAM arrays that do not employ the common electrode between different MRAM bit cells, thus further varying the read window of the MRAM it cells and sensing margin.

Thus, in exemplary aspects disclosed herein, dedicated read operation circuit paths are provided for each MRAM bit cell separate from the write operation circuit path. The read operation circuit paths provided a dedicated path for a read current to flow from each MRAM bit cell as a result of applying a read voltage to a given MRAM bit cell in a read operation. The read current is not dependent on the write operation current path. In this manner, as an example, the read operation circuit paths for the MRAM bit cells do not vary as a result of the layout of the MRAM bit cell with respect to the common electrode and their distance to the write operation transistors coupled to the common electrode. Thus, the read parasitic resistances of the MRAM bit cells do not vary from each other because of the different layout locations of their MTJs along different portions of the common electrode, and resulting varying distances from the write operation transistors coupled to the common electrode forming the write operation circuit path. In exemplary aspect, to provide dedicated read operation circuit paths for each MRAM bit cell separate from the write operation circuit path, an additional read operation transistor is provided and coupled to each MRAM bit cell to activate and form a path of the read operation circuit path for its respective MRAM bit cell. In this manner, the separate read operation transistors can be controlled separately from the write operation transistors to provide a separate read operation circuit path. Further, because less read current is needed for MRAM bit cell read operations, the separate read operation transistors can be sized smaller than conventional access transistors that form a common write and read operation circuit path to allow for an increase in density of MRAM bit cells over conventional MRAM designs.

In this regard in one exemplary aspect, an MRAM bit cell circuit is provided. The MRAM bit cell circuit comprises a plurality of MRAM bit cells each comprising, a first electrode and a second electrode and an MTJ device. The MTJ device comprises a tunnel barrier between the first electrode and the second electrode, a pinned layer between the tunnel barrier and the second electrode, and a free layer between the tunnel barrier and the first electrode. Each MRAM bit cell among the plurality of MRAM bit cells also comprises an access transistor coupled to one of the first electrode or the second electrode. The MRAM bit cell circuit also comprises a common electrode comprising either the first electrodes or the second electrodes of the plurality of MRAM bit cells, the common electrode comprising a first end portion and a second end portion. The MRAM bit cell circuit also comprises a first write operation transistor coupled to the first end portion of the common electrode such that a write current flowing through the first write operation transistor flows through each of the first electrodes or the second electrodes of the common electrode. The MRAM bit cell circuit also comprises a second write operation transistor coupled to the second end portion of the common electrode such that a write current flowing through the second write operation transistor flows through each of the first electrodes or the second electrodes of the common electrode. The first write operation transistor and the second write operation transistor, when activated, are configured to provide a common write operation circuit path through the common electrode for the plurality of MRAM bit cells. The MRAM bit cell circuit also comprises a plurality of read operation transistors each coupled to a respective first electrode or second electrode of an MRAM bit cell among the plurality of MRAM bit cells. Each read operation transistor among the plurality of read operation transistors, when activated, configured to provide a dedicated read operation circuit path for its respective MRAM bit cell, separate from the common write operation circuit path.

In another exemplary aspect, a method of performing an access operation to an MRAM bit cell among a plurality of MRAM bit cells in an MRAM bit cell circuit, in response to a read operation to an MRAM bit cell among the plurality of MRAM bit cells, is provided. The method comprises controlling a first write operation transistor coupled to a first end portion of a common electrode of the plurality of MRAM bit cells to present an impedance to the common electrode to decouple the first write operation transistor from the common electrode. The method also comprises controlling a second write operation transistor coupled to a second end portion of the common electrode of the plurality of MRAM bit cells to present an impedance to the common electrode to decouple the second write operation transistor from the common electrode. The method also comprises activating an access transistor coupled between a source line and the MRAM bit cell to be read to couple a source voltage to the MRAM bit cell and activating a read operation transistor coupled between a bit line (BL), the common electrode, and the MRAM bit cell to be read, to create a read operation circuit path between the source line (SL) and the bit line (BL), to cause a read current to flow between the source line (SL) and the bit line (BL).

In another exemplary aspect, an MRAM is provided. The MRAM comprises a plurality of MRAM bit cell rows each comprising an MRAM bit cell circuit. The MRAM bit cell circuit comprises a plurality of MRAM bit cells each comprising a first electrode and a second electrode, and an MTJ device. The MTJ device comprises a tunnel barrier between the first electrode and the second electrode, a pinned layer between the tunnel barrier and the second electrode, and a free layer between the tunnel barrier and the first electrode. Each MRAM bit cell among the plurality of MRAM bit cells also comprises an access transistor coupled between one of the first electrode or the second electrode and a source line (SL). The MRAM bit cell circuit also comprises a common electrode comprising either the first electrodes or the second electrodes of the plurality of MRAM bit cells, the common electrode comprising a first end portion and a second end portion. The MRAM bit cell circuit also comprises a first write operation transistor coupled to the first end portion of the common electrode such that a write current flowing through the first write operation transistor flows through each of the first electrodes or the second electrodes of the common electrode. The first write operation transistor comprises a first write enable input coupled to a write enable line. The MRAM bit cell circuit also comprises a second write operation transistor coupled to the second end portion of the common electrode such that a write current flowing through the second write operation transistor flows through each of the first electrodes or the second electrodes of the common electrode. The second write operation transistor comprises a second write enable input coupled to the write enable line. The first write operation transistor and the second write operation transistor, when activated, are configured to provide a common write operation circuit path through the common electrode for the plurality of MRAM bit cells. The MRAM bit cell circuit also comprises a plurality of read operation transistors each coupled to a respective first electrode or second electrode of an MRAM bit cell among the plurality of MRAM bit cells. Each read operation transistor among the plurality of read operation transistors, when activated, is configured to provide a dedicated read operation circuit path for its respective MRAM bit cell, separate from the common write operation circuit path. The MRAM bit cell circuit also comprises a bit line (BL) column selector circuit comprising the plurality of read operation transistors for the plurality of MRAM bit cells, a plurality of dedicated bit lines (BL) coupled to respective sources of the plurality of read operation transistors, a read enable input coupled to a read enable line, and a memory address input configured to receive a memory address for a read operation. The MRAM bit cell circuit also comprises a source line (SL) column selector circuit. The source line (SL) column selector circuit comprises a plurality of source line (SL) transistors each coupled between a voltage source to a source line (SL) of an access transistor among the plurality of MRAM bit cells, a read enable input coupled to a read enable line, a write enable input coupled to a write enable line, and a memory address input configured to receive a memory address for an access operation.

BRIEF DESCRIPTION OF THE FIGURES

FIG. 3B-1 illustrates an initialization stage of a write operation to MRAM bit cells in a memory row in the VoCSM of FIG. 3A;

FIG. 3B-2 illustrates a write data stage of a write operation to the MRAM bit cells in the memory row in the VoCSM in FIG. 3A;

FIGS. 15A-15F illustrate exemplary fabrication stages of an MRAM bit cell of a voltage-switched MRAM employing a shared bottom electrode and shared write operation transistors for each MRAM bit cells row that allows decoupling of MRAM bit cell density from write operation transistor layout, and further supporting a dedicated read operation transistor to provide fixed spin torque read paths to separate read and write operation circuit paths.

DETAILED DESCRIPTION

Figure 1:
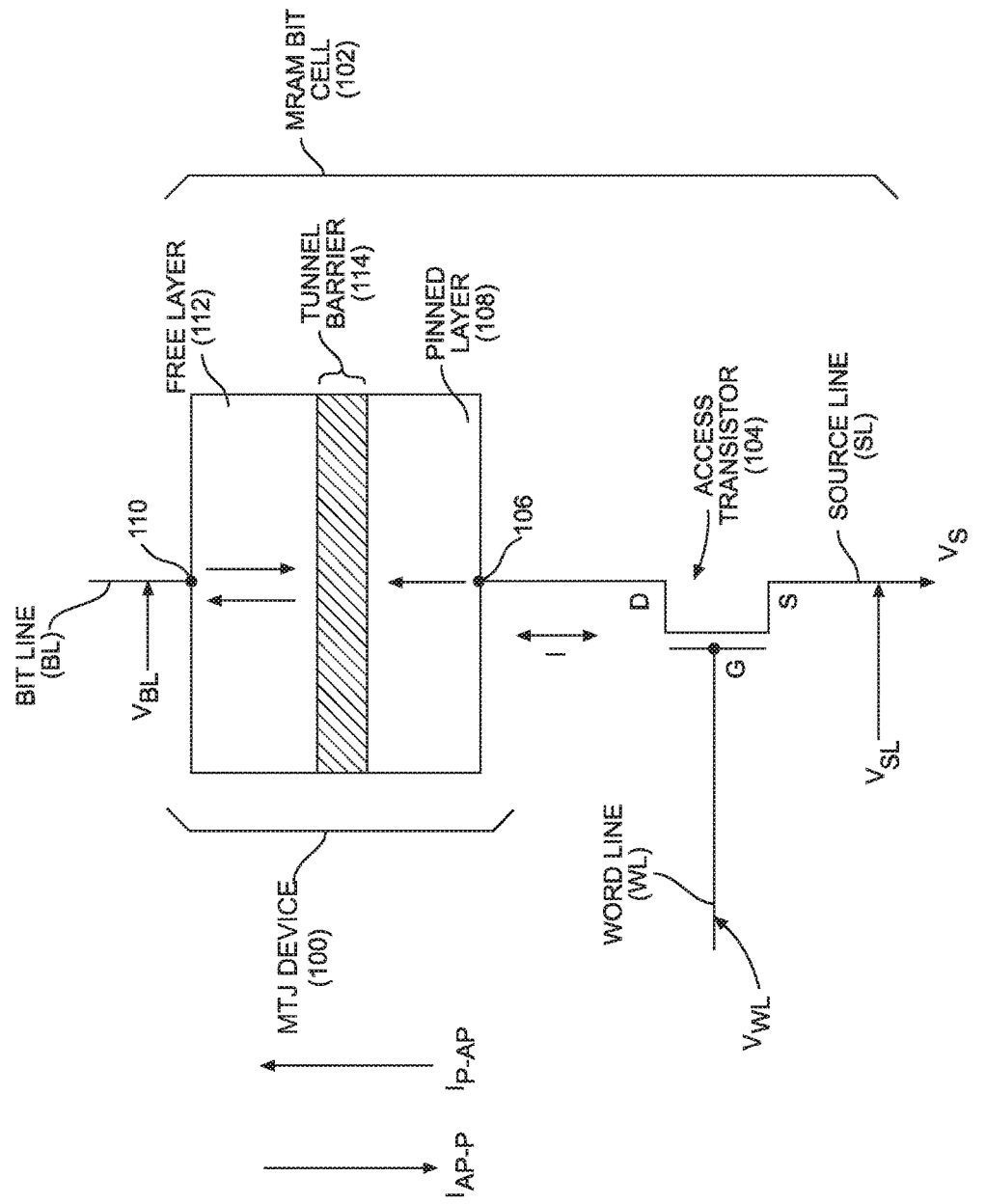
FIG. 1 is a schematic diagram of an exemplary magneto-resistive random access memory (MRAM) bit cell that can be provided in an MRAM array in an integrated circuit (IC)

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include voltage-switched magneto-resistive random access memory (MRAM) employing separate read operation circuit paths from a shared spin torque write operation circuit path. In exemplary aspects disclosed herein, the MRAM includes an MRAM array that includes one or more MRAM bit cell rows that each include a plurality of MRAM bit cells. Each MRAM bit cell includes a magnetic tunnel junction (MTJ) device that is configured to either be in a parallel (P) or anti-parallel (AP) magnetization state to store representations of a logical '0' and '1' for providing memory storage. MRAM bit cells on an MRAM bit cell row share a common electrode (e.g., top or bottom electrode) to provide a shared write operation circuit path. Two write operation transistors coupled to each end portion of the common electrode are activated in response to a write operation to form a write circuit path for write current to flow between the write operation transistors. The write operation transistors are controlled to control direction of the write current through the common electrode, which controls the direction of spin torque applied to the respective MTJ device of the MTJ bit cells. To write data to selected MRAM bit cells in the MRAM bit cell row, a negative voltage is applied to each non-shared electrode of the MRAM bit cells to be written to lower the energy barrier of its respective MTJ device with the spin torque applied as a result of current flowing through the common electrode to switch the magnetic orientation (i.e., magnetic moment direction) of the MTJ devices to be written. In this manner, a write operation transistor is not required for each MRAM bit cell such that density of the MRAM bit cells is controlled by the layout of the write operation transistors. Further, by lowering the energy barrier of MTJ devices of the MRAM bit cells to be written in a write operation, less energy is required to write data to the MRAM bit cells. However, for read operations, if the common electrode also forms the read operation circuit path for carrying read current generated as a result of applying a read voltage to an MRAM bit cell to be read, the read operation circuit path will vary based on which MRAM bit cell is being written, thus varying read parasitic resistance resulting from the common electrode of the MRAM bit cells. This is because the MTJ devices of each MRAM bit cell are located along different portions of the common electrode, and thus located different distances from the write operation transistors. Read parasitic resistance affects the tunnel magnetoresistance (TMR) ratio of an MTJ device, thus affecting the read window. Further, the common electrode may increase read parasitic resistance over conventional MRAM arrays that do not employ the common electrode between different MRAM bit cells, thus further varying the read window of the MRAM it cells and sensing margin.

Thus, in exemplary aspects disclosed herein, dedicated read operation circuit paths are provided for each MRAM bit cell separate from the write operation circuit path. The read operation circuit paths provided a dedicated path for a read current to flow from each MRAM bit cell as a result of applying a read voltage to a given MRAM bit cell in a read operation. The read current is not dependent on the write operation current path. In this manner, as an example, the read operation circuit paths for the MRAM bit cells do not vary as a result of the layout of the MRAM bit cell with respect to the common electrode and their distance to the write operation transistors coupled to the common electrode. Thus, the read parasitic resistances of the MRAM bit cells do not vary from each other because of the different layout locations of their MTJs along different portions of the common electrode, and resulting varying distances from the write operation transistors coupled to the common electrode forming the write operation circuit path. In exemplary aspect, to provide dedicated read operation circuit paths for each MRAM bit cell separate from the write operation circuit path, an additional read operation transistor is provided and coupled to each MRAM bit cell to activate and form a path of the read operation circuit path for its respective MRAM bit cell. In this manner, the separate read operation transistors can be controlled separately from the write operation transistors to provide a separate read operation circuit path. Further, because less read current is needed for MRAM bit cell read operations, the separate read operation transistors can be sized smaller than conventional access transistors that form a common write and read operation circuit path to allow for an increase in density of MRAM bit cells over conventional MRAM designs.

Figure 2:
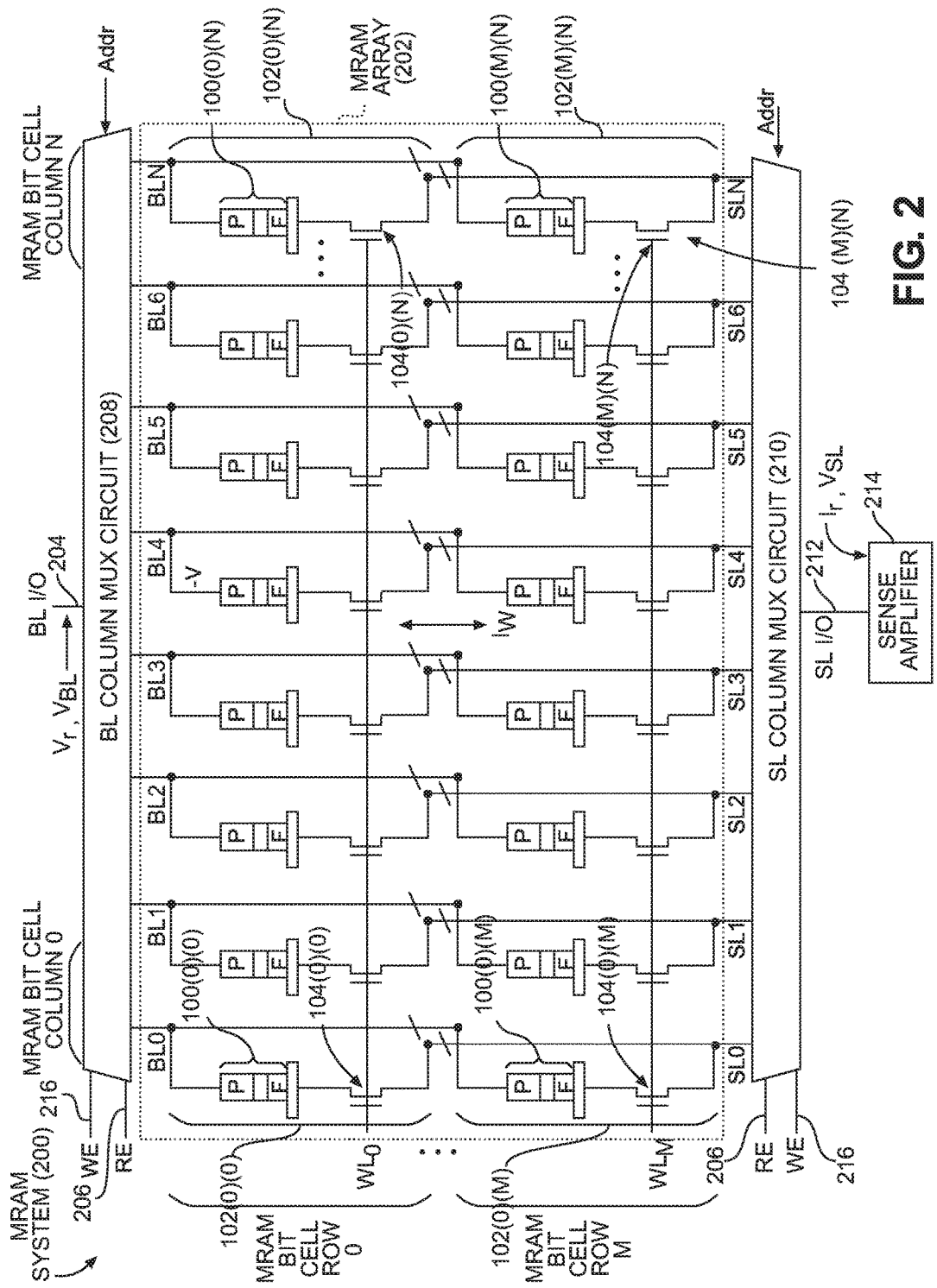
FIG. 2 is a schematic diagram of an MRAM system that includes an MRAM array with MRAM bit cells like the MRAM bit cell in FIG. 1 organized in memory rows and columns for storing multi-bit data words in each memory row.
Figure 3A:
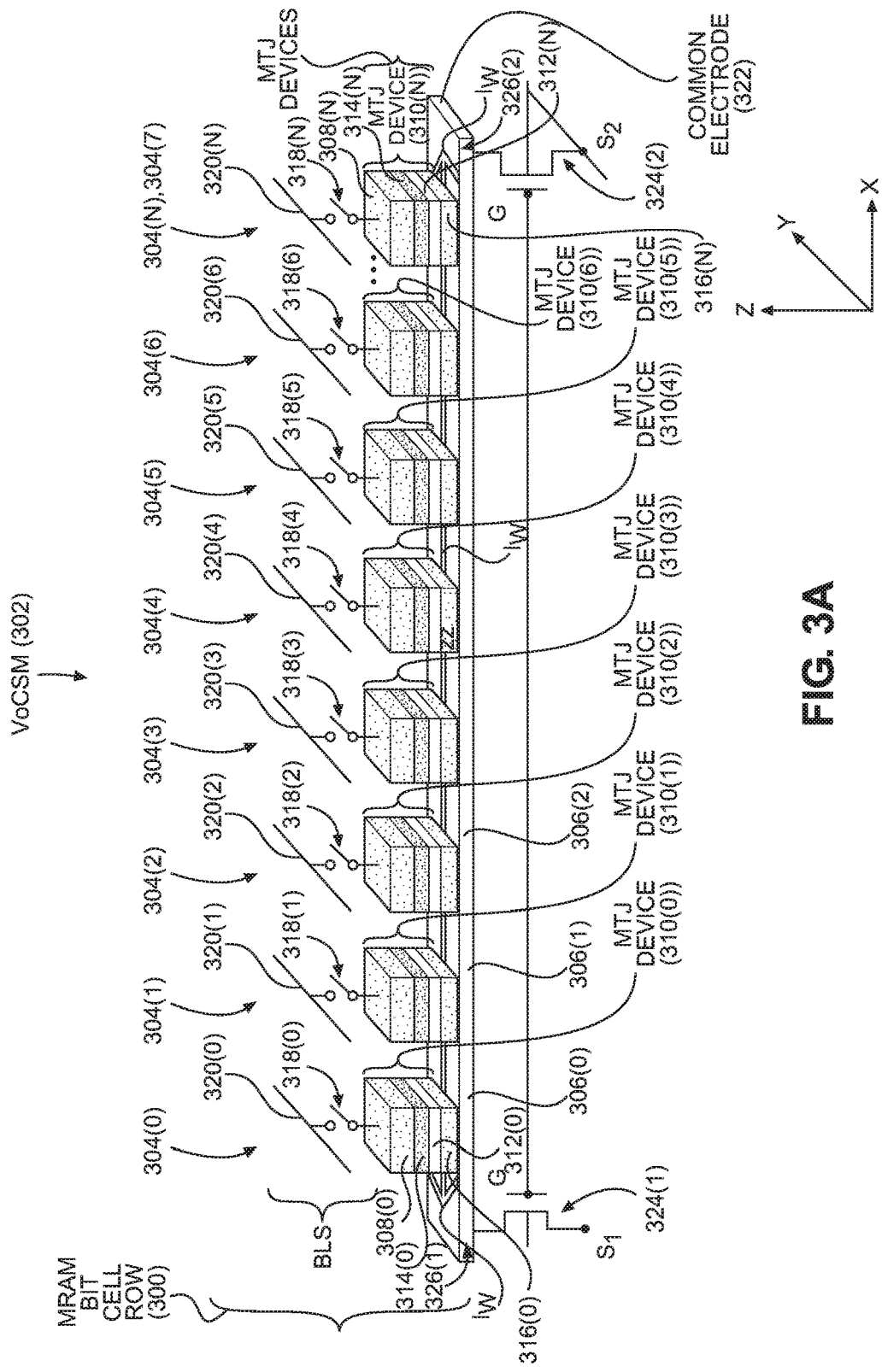
FIG. 3A is a schematic diagram of a memory row of a voltage-control spintronics MRAM (VoCSM) that includes a shared bottom electrode providing shared read and write operation circuits paths when employing voltage-control-magnetic-anisotropy (VCMA) effect for read operations and spin torque for write operations.

Before discussing examples of voltage-switched MRAM employing a common shared electrode for providing a write operation circuit path and separate, dedicated spin torque read operation circuit paths to reduce read parasitic resistance during read operations, an example of a voltage-control spintronics MRAM (VoCSM) that employs a common electrode that provides a shared read and write operation circuits paths is first discussed with regard to FIGS. 3A-3B2.

In this regard, FIG. 3A is a schematic diagram of a memory bit cell row 300 of a voltage-control spintronics MRAM (VoCSM) 302 employing a voltage-control-magnetic-anisotropy (VCMA) effect for read operations and spin torque for write operations. The memory bit cell row 300 comprises a plurality of MRAM bit cells 304(0)-304(N), where 'N' can be any number of MRAM bit cells desired. For example, eight (8) MRAM bit cells 304(0)-304(N), 304(7) (i.e., 'N'=7) may be provided in the memory bit cell row 300. Each MRAM bit cell 304(0)-304(N) includes a first electrode 306(0)-306(N) and a second electrode 308(0)-308(N). The first electrodes 306(0)-306(N) may be considered bottom electrodes, and the second electrodes 308(0)-308(N) may be considered top electrodes. In this example, in-plane magnetic tunnel junction (MTJ) devices 310(0)-310(N) are disposed between respective first and second electrodes 306(0)-306(N), 308(0)-308(N). The MTJ devices 310(0)-310(N) are configured to store data as either a parallel or anti-parallel (AP) magnetic orientation. In this regard, each MTJ device 310(0)-310(N) includes a tunnel barrier 312(0)-312(N), which is made from an insulating material, such a magnesium oxide (MgO) for example. Each MTJ device 310(0)-310(N) also includes a pinned layer 314(0)-314(N) having a fixed magnetic moment orientation and located between the respective tunnel barrier 312(0)-312(N) and the second electrodes 308(0)-308(N). Each MTJ device 310(0)-310(N) also includes a free layer 316(0)-316(N) located between the respective first electrodes 306(0)-306(N) and the tunnel barrier 312(0)-312(N). The magnetic moment orientation of the free layers 316(0)-316(N) can rotate between a parallel (P) and anti-parallel (AP) direction with respect to the magnetic moment orientation of its pinned layer 314(0)-314(N). Each MRAM bit cell 304(0)-304(N) also includes a respective access transistor 318(0)-318(N) coupled to the respective first electrodes 306(0)-306(N) to control the coupling of respective bit lines (BLs) 320(0)-320(N) to the second electrodes 308(0)-308(N).

With continuing reference to FIG. 3A, the second electrodes 306(0)-306(N) form a common electrode 322. A first write operation transistor 324(1) is coupled to a first end portion 326(1) of the common electrode 322 such that when the first write operation transistor 324(1) is activated by a word line (WL) (e.g., by a voltage pulse), a write current $I_w$ flowing through the first write operation transistor 324(1) flows through the common electrode 322 as part of a write operation circuit path. A second write operation transistor 324(2) is coupled to a second end portion 326(2) of the common electrode 322 such that when the second write operation transistor 324(2) is activated by the word line (WL), a write current $I_w$ flowing through the second write operation transistor 324(2) flows through the common electrode 322 as part of a write operation circuit path.

To perform a write operation, a write initialization stage is performed. The gates G of the first and second write operation transistors 324(1), 324(2) are activated to turn on the first and second write operation transistors 324(1), 324(2). A positive supply voltage is applied to a source $S_1$ of the first write operation transistor 324(1), and a negative or zero supply voltage is applied to a source $S_2$ of the second write operation transistor 324(2) to cause a first write current $I_{w1}$ to flow from left to right through the common electrode 322, as shown in FIGS. 3A and 3B-1. This creates a spin torque in a first Y-axis direction on the free layers 316(0)-316(N) of the MTJ devices 310(0)-310(N), as shown in FIG. 3B-1. The first and second write operation transistors 324(1), 324(2) are activated, and a negative activation voltage Va is applied to the bit lines (BL) 320(0)-320(N) with the access transistors 318(0)-318(N) activated to apply the negative activation voltage Va to the second electrodes 308(0)-

308(N) of the MRAM bit cells 304(0)-304(N). This lowers the energy barrier of the MTJ devices 310(0)-310(N) by a voltage-control-magnetic-anisotropy (VCMA) effect requiring less first write current $I_{w1}$ to change the magnetization orientation of the free layers 316(0)-316(N). By lowering the energy barrier the MTJ devices 310(0)-310(N) during a write operation, an external magnetic field is not required to switch the magnetic orientation state of the MTJ devices 310(0)-310(N). In this example, the magnetization orientation of the free layers 316(0)-316(N) are changed to be P to the magnetization orientation of the pinned layers 314(0)-314(N) to store logical '0' values.

Then, during a write data stage, a negative or zero supply voltage is applied to a source $S_1$ of the first write operation transistor 324(1), and a positive supply voltage is applied to a source $S_2$ of the second write operation transistors 324(2) to cause a second write current $I_{w2}$ to flow from right to left through the common electrode 322, as shown in FIG. 3B-2. For the MRAM bit cells 304(0)-304(N) that are to be written to a logical '1' value, the negative activation voltage Va is applied to the bit lines (BL) 320(0)-320(N) with the access transistors 318(0)-318(N) activated to apply the negative activation voltage Va to the first electrodes 306(0)-306(N) of the MRAM bit cells 304(0)-304(N). The magnetic orientation of the of the free layers 316(0)-316(N) to the MRAM bit cells 304(0)-304(N) with the negative activation voltage Va applied will be change to an AP state to the magnetization orientation of the pinned layers 314(0)-314(N), because the second write current $I_{w2}$ is flowing oppositely from right to left through the common electrode 322 to create an opposite spin torque in a second, opposite Y-axis direction on the free layers 316(0)-316(N) from the spin torque applied on the free layers 316(0)-316(N), from when the first write current $I_{w1}$ flows from left to right through the common electrode 322, as shown in FIG. 3B-1. For the MRAM bit cells 304(0)-304(N) that are not to be written to and thus stay a logical '0' value, a positive deactivation voltage Vda is applied to the bit lines (BLs) 320(0)-320(N) with the access transistors 318(0)-318(N) activated to apply the positive deactivation voltage Vda to the first electrodes 306(0)-306(N) of the MRAM bit cells 304(0)-304(N). This heightens the energy barrier of the MTJ devices 310(0)-310(N) that are not to be written so that the spin torque applied on the free layers 316(0)-316(N) when the first write current $I_{w1}$ flows from left to right through the common electrode 322 is not sufficient to change the magnetic orientation of those free layers 316(0)-316(N).

In a read operation, a positive voltage is applied to a bit line (BL) 320(0)-320(N) associated with the MRAM bit cell 304(0)-304(N) to be read to heighten the energy barrier of the respective MTJ device 310(0)-310(N) and avoid read-disturbance issues. The respective access transistor 318(0)-318(N) of the MRAM bit cell 304(0)-304(N) to be read is activated to apply the positive voltage to a respective MTJ device 310(0)-310(N) to cause a read current to flow through the MTJ device 310(0)-310(N) and to either the first or second write operation transistor 324(1), 324(2). Only one of the first or second write operation transistors 324(1), 324(2) needs to be activated to form a read operation circuit path between the respective bit line (BL) 320(0)-320(N) of the MRAM bit cell 304(0)-304(N) to be read and a source line $S_1$ or $S_2$. The read current can be sensed to determine the logical state stored in the MRAM bit cell 304(0)-304(N) to be read, because the read current will be a function of the resistance of the MTJ device 310(0)-310(N), which varies based on whether the MTJ device 310(0)-310(N) is in a P or AP magnetization state.

For read operations, the read operation circuit path for read current to flow from the respective bit line (BL) 320(0)-320(N) of the MRAM bit cell 304(0)-304(N) to be read and the source line $S_1$ or $S_2$ of the activated first or second write operation transistor 324(1), 324(2) will vary in path length. This is because the MRAM bit cells 304(0)-304(N) are disposed in different locations along the X-axis direction of the common electrode 322, as shown in FIG. 3A. Thus, for example, read current flowing through MRAM bit cell 304(4) will travel farther than read current flowing through MRAM bit cell 304(0), because read current flowing through MRAM bit cell 304(4) will flow through additional portions of the common electrode 322. Thus, the read parasitic resistance attributed to the common electrode 322 coupled to the MRAM bit cells 304(0)-304(N) will vary based on which MRAM bit cells 304(0)-304(N) is being read in a read operation. This variation in read parasitic resistance can reduce the reading sensing window for the MRAM bit cells 304(0)-304(N). Also, the read parasitic resistance may be higher than in traditional MRAM designs that do not include the common electrode 322 providing part of the read operation circuit path. An increase in read parasitic resistance can affect the tunnel magneto-resistance (TMR) ratio of the MTJ devices 310(0)-310(N) of MRAM bit cells 304(0)-304(N), which can affect their performance and sensing margin. It therefore may be desired to reduce this read parasitic resistance to improve performance.

Figure 4A:
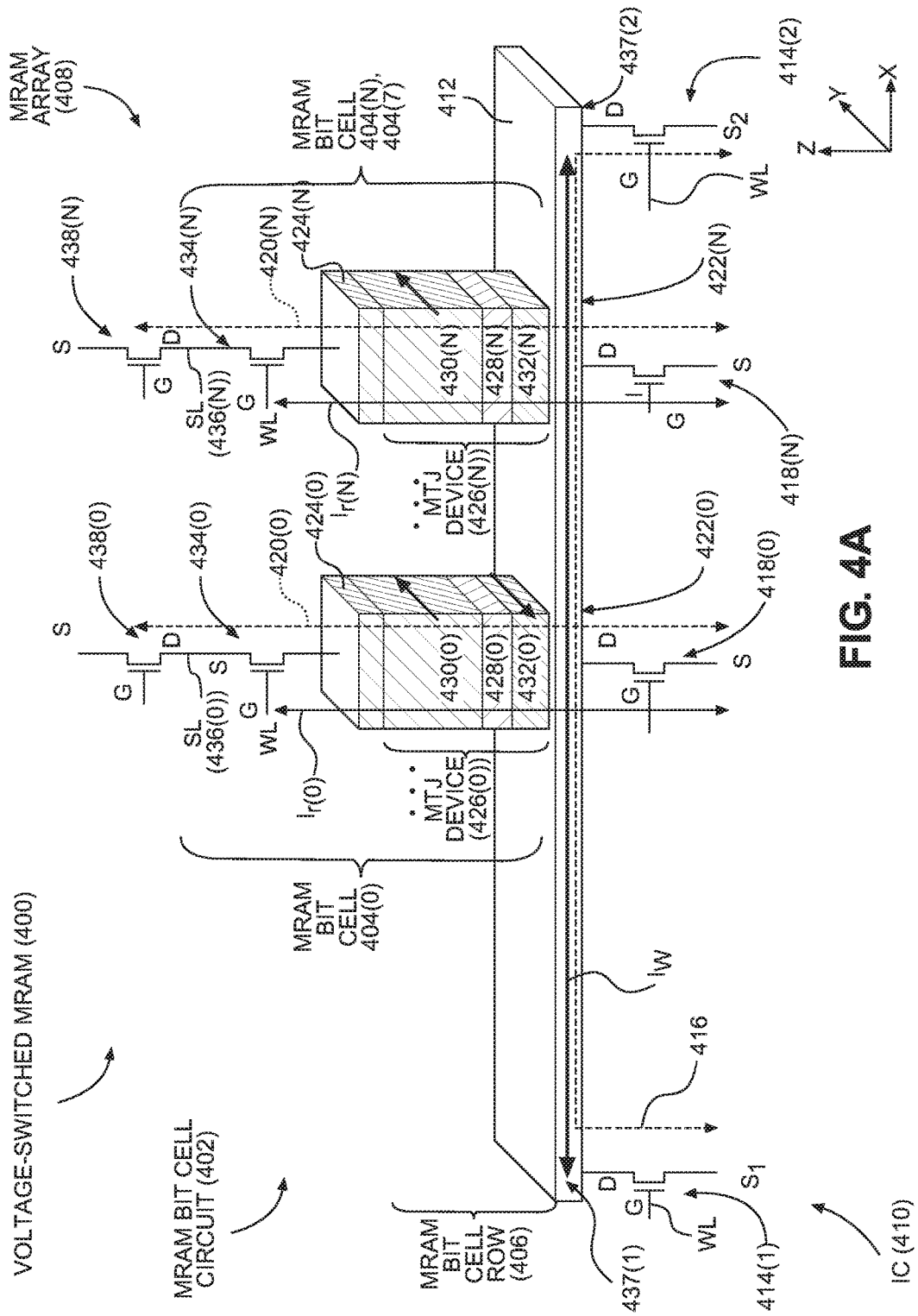
FIG. 4A is a schematic diagram of an exemplary voltage-switched MRAM illustrating an MRAM bit cell circuit employing multiple MRAM bit cells with separate read operation circuit paths from a shared spin torque write operation circuit path to separate read and write operation circuit paths for reducing parasitic read resistance during read operations.
Figure 4B:
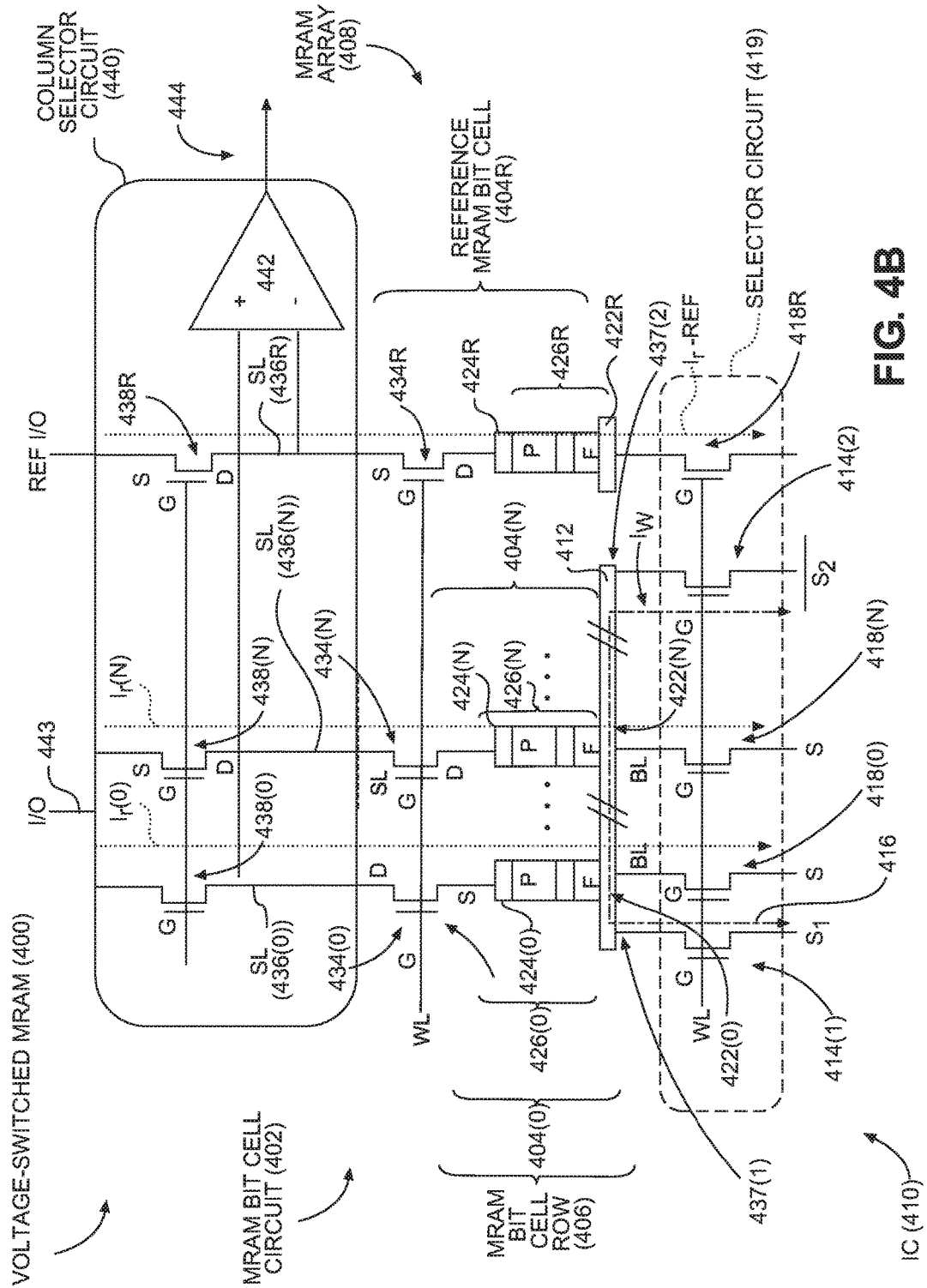
FIG. 4B is an exemplary circuit diagram of the MRAM bit cell row of the voltage-switched MRAM in FIG. 4A.

In this regard, FIG. 4A is a schematic diagram of an exemplary voltage-switched MRAM 400 that includes an MRAM bit cell circuit 402 that includes a plurality of MRAM bit cells 404(0)-404(N). For example, the MRAM bit cell circuit 402 may be an MRAM bit cell row 406 that includes multiple MRAM bit cells 404(0)-404(N). A plurality of MRAM bit cell circuits 402 may be included in the voltage-switched MRAM 400 to provide memory for a processor-based device. For example, the voltage-switched MRAM 400 may be included in an MRAM array 408 in an integrated circuit (IC) 410. As will be discussed in more detail below, the MRAM bit cell circuit 402 in FIG. 4A employs a shared, common electrode 412 coupled to first and second write operation transistors 414(1), 414(2) for performing write operations to the MRAM bit cells 404(0)-404(N). The write operation transistors 414(1), 414(2) may be included as part of a selector circuit 419, such as a bit line (BL) column multiplexor (mux) circuit as shown in FIG. 4B. The write operation transistors 414(1), 414(2) are configured to be activated (e.g., by a voltage pulse) to cause a write current $I_w$ to flow through the common electrode 412 in a write operation circuit path 416 to create to a spin torque on the MRAM bit cells 404(0)-404(N). Providing the common electrode 412 for the MRAM bit cells 404(0)-404(N) allows the two (2) write operation transistors 414(1), 414(2) to drive the write current $I_w$ to flow through the common electrode 412 to create a spin torque on each of MRAM bit cells 404(0)-404(N) to avoid having to provide a dedicated write operation transistor for each the MRAM bit cell 404(0)-404(N). This also allows decoupling of MRAM bit cell 404(0)-404(N) density from a write operation transistor layout.

With continuing reference to FIG. 4A, and as will be discussed in more detail below, to reduce read parasitic resistance during read operations, the MRAM bit cell circuit 402 further employs dedicated read operation transistors 418(0)-418(N) for each MRAM bit cell 404(0)-404(N). The read operation transistors 418(0)-418(N) may be provided as part of a column selector circuit, such as a bit line (BL) column multiplexor (mux) circuit. The read operation transistors 418(0)-418(N) are each configured to be activated in a response to a read operation. The read operation transistors 418(0)-418(N) create separate read operation circuit paths 420(0)-420(N) through each of the respective MRAM bit cells 404(0)-404(N) so that the read operation circuit path 420(0)-420(N) is not established through the common electrode 412 to either the first or second write operation transistors 414(1)-414(2), which would otherwise create different length read operation circuit paths 420(0)-420(N) for each of the MRAM bit cells 404(0)-404(N), like shown in the VoCSM 302 in FIG. 3A for example. The read operation transistors 418(0)-418(N) create dedicated read operation circuit paths 420(0)-420(N) for each respective MRAM bit cell 404(0)-404(N). This allows a read current $I_{r(0)}$-$I_{r(N)}$ to flow through the respective MRAM bit cell 404(0)-404(N) in its dedicated read operation circuit path 420(0)-420(N) as part of a read operation. Because the magnetic orientation state of the MRAM bit cells 404(0)-404(N) affects the resistance of the MRAM bit cell 404(0)-404(N), the read current $I_{r(0)}$-$I_{r(N)}$ flowing through the respective MRAM bit cell 404(0)-404(N) can be sensed to determine the magnetic orientation state of a read MRAM bit cell 404(0)-404(N). In this manner, as an example, the read operation circuit paths 420(0)-420(N) for the MRAM bit cells 404(0)-404(N) do not vary as a result of the layout of the MRAM bit cells 404(0)-404(N) with respect to the common electrode 412 and their distance to the write operation transistors 414(1), 414(2) coupled to the common electrode 412. Thus, the read parasitic resistances of the MRAM bit cells 404(0)-404(N) do not vary from each other for read operations because of the different layout locations of their MRAM bit cells 404(0)-404(N) along different portions of the common electrode 412. Further, because less read current $I_{r(0)}$-$I_{r(N)}$ is needed than write current $I_w$ for read operations, the separate read operation transistors 418(0)-418(N) can be sized smaller than conventional transistors used to create a common write and read operation circuit path to allow for an increase in density of MRAM bit cells 404(0)-404(N) over conventional MRAM designs.

FIG. 4B is a circuit diagram of the voltage-switched MRAM 400 in FIG. 4A. With reference to FIGS. 4A and 4B, the MRAM bit cell circuit 402 comprises the plurality of MRAM bit cells 404(0)-404(N), where 'N' can be any number of MRAM bit cells desired. For example, eight (8) MRAM bit cells 404(0)-404(N), 404(7) (i.e., 'N'=7) may be provided in the MRAM bit cell circuit 402. Each MRAM bit cell 404(0)-404(N) includes a first electrode 422(0)-422(N) and a second electrode 424(0)-424(N). The first electrodes 422(0)-422(N) may be considered bottom electrodes, and the second electrodes 424(0)-424(N) may be considered top electrodes. The first electrodes 422(0)-422(N) are part of the common electrode 412. In this example, the MRAM bit cells 404(0)-404(N) include in-plane or perpendicular MTJ devices 426(0)-426(N) disposed between respective first and second electrodes 422(0)-422(N), 424(0)-424(N). The MTJ devices 426(0)-426(N) are configured to store data as either a parallel (P) or anti-parallel (AP) magnetic orientation (i.e., magnetic moment direction). In this regard, as shown in FIG. 4A, each MTJ device 426(0)-426(N) includes a tunnel barrier 428(0)-428(N), which is made from an insulating material, such a magnesium oxide (MgO) for example. Each MTJ device 426(0)-426(N) also includes a pinned layer 430(0)-430(N) having a fixed magnetic moment orientation and located between the respective tunnel barrier 428(0)-428(N) and the second electrodes 424(0)-424(N) in this example. Each MTJ device 426(0)-426(N) also includes a free layer 432(0)-432(N) located between the respective first electrodes 422(0)-422(N) and the tunnel barriers 428(0)-428(N). In this example, the MTJ devices 426(0)-426(N) are provided in a top-pinned arrangement. The magnetic moment orientation of the free layers 432(0)-432(N) can rotate between a parallel (P) and anti-parallel (AP) direction with respect to the magnetic moment orientation of its pinned layers 430(0)-430(N). Each MRAM bit cell 404(0)-404(N) also includes a respective access transistor 434(0)-434(N) coupled to the respective second electrodes 424(0)-424(N) to control the coupling of respective source lines (SLs) 436(0)-436(N) to the second electrodes 424(0)-424(N). The access transistors 434(0)-434(N) each include a gate coupled to a word line (WL), a source S coupled to a respective source line 436(0)-436(N), and a drain D coupled to the second electrodes 424(0)-424(N) in this example.

With continuing reference to FIGS. 4A and 4B, the first write operation transistor 414(1) is coupled to a first end portion 437(1) of the common electrode 412. The second write operation transistor 414(2) is coupled to a second end portion 437(2) of the common electrode 412. As will be discussed in more detail below, to perform a write operation, the first and second write operation transistors 414(1), 414(2) are activated by an enable signal by a word line (WL). The first and second write operation transistors 414 (1), 414(2) each include a gate G coupled to the word line (WL), a drain D coupled to the respective first end portion 437(1) and the second end portion 437(2) of the common electrode 412, and respective sources $S_2$, $S_2$ configured to be coupled to write driver circuits as a source of write current $I_w$. Activating the first and second write operation transistors 414(1), 414(2) causes the write operation circuit path 416 to be created to cause the write current $I_w$ to flow through the first and second write operation transistors 414(1), 414(2) and through the common electrode 412 as part of the write operation circuit path 416. The write current $I_w$ creates a spin torque effect on the MTJ devices 426(0)-426(N) in the MRAM bit cell circuit 402 that can modify the magnetic orientation (i.e., magnetic moment direction) of their free layers 432(0)-432(N) to represent a magnetic orientation state.

Spin torque can be created by a spin transfer torque (STT) and a spin orbit torque (SOT), as non-limiting examples. STT is an effect in which the magnetic orientation of a magnetic free layer in MTJ devices can be modified using a spin-polarized current. A spin-polarized current is created by passing a current through a magnetic pinned layer or the common electrode 412. The angular moment (i.e., torque) of the spin-polarized current can be locally transferred to the free layer to modify its magnetic orientation. In this example, the first write current $I_{w1}$ flowing through the common electrode 412 can generate spin-polarized currents that induce a local spin torque on the MTJ devices 426(0)-426(N) and their free layers 432(0)-432(N) to change their magnetic orientation.

A SOT can also be employed to generate spin torque on the free layers 432(0)-432(N) of the MTJ devices 426(0)-426(N). A SOT is a magnetic torque that is generated through spin-orbit interactions by exploiting the spin-Hall effect generated by the flow of a spin current perpendicular to an applied charge in the plane of a ferromagnetic/metal bi-layer. For example, a SOT can be generated in the free layers 432(0)-432(N) of the MTJ devices 426(0)-426(N) by a perpendicular spin current with transverse polarization flowing through the MTJ devices 426(0)-426(N) with the first write current $I_{w1}$ as a charge current applied to the common electrode 412. Spin torque can be generated by activating and applying a voltage to the first and second write operation transistors 414(1) and 414(2) to generate the write current $I_{w1}$ or $I_{w2}$. The selection transistors 438(0)-438(N) to create a voltage differential between the top electrodes 424(0)-424(N) of the MTJ devices 426(0)-426(N) and the common electrode 412 to lower the energy barrier for a write operation. For example, the common electrode 412 can be made of a heavy metal in conjunction with the free layers 432(0)-432(N) to form a bi-layer that includes a metal layer that may be a Platinum (Pt), Tantalum (Ta), Tungsten, (W), or a Rhenium (Re) material. The spin-Hall angle and the resistivity of the metal layers in the common electrode 412 are the two main characteristics that affect the generated SOT.

As will also be discussed in more detail below, and with continued reference to FIGS. 4A and 4B, to perform a read operation to the MRAM bit cells 404(0)-404(N) in the MRAM bit cell circuit 402, the access transistors 434(0)-434(N) for the MRAM bit cell circuit 402 are activated by an enable signal by a word line (WL). A selection transistor 438(0)-438(N) is coupled to the respective access transistor 434(0)-434(N) for the particular MRAM bit cell 404(0)-404(N) to be read to activate the read operation circuit path 420(0)-420(N) through the MRAM bit cell 404(0)-404(N) to be read. The selection transistors 438(0)-438(N) may be part of a column selector circuit 440 as shown in FIG. 4B, such as a source line (SL) column multiplexor (mux) circuit. The selection transistors 438(0)-438(N) may be configured to couple a voltage from an I/O line 443 indicating the MRAM bit cell 404(0)-404(N) to be read based on a memory address for the read operation. Also with reference to FIG. 4B, a reference selection transistor 438R may be provided and configured to be coupled to a reference access transistor 434R as part of a reference MRAM bit cell 404R. The reference MRAM bit cell 404R includes one or more reference MTJ devices 426R disposed between first and second reference electrodes 422R, 424R similar to the MRAM bit cells 404(0)-404(N). The reference MRAM bit cell 404R may include both P and AP magnetic orientation MTJ devices to form an average of reference resistances. The reference MRAM bit cell 404R is not coupled to the common electrode 412. During a read operation, the activation of the selection transistor 438(0)-438(N), the access transistor 434(0)-434(N), and the read operation transistor 418(0)-418(N) for the MRAM bit cell 404(0)-404(N) to be read causes the read current $I_{r(0)}$-$I_{r(N)}$ to flow through the read MRAM bit cell 404(0)-404(N). The activation of the reference selection transistor 438R, the reference access transistor 434R, and the reference read operation transistor 418R causes a reference current $I_{r\text{-}ref}$ through the reference MRAM bit cell 404R. A comparator circuit 442 compares the read current $I_{r(0)}$-$I_{r(N)}$ flowing through the read MRAM bit cell 404(0)-404(N) to the reference current $I_{r\text{-}ref}$ to determine the magnetic orientation state stored in the read MRAM bit cell 404(0)-404(N) to generate a read output 444. The reference MTJ device 426R has a same reference access transistor 434R and reference selection transistor 438R as the access transistors 434(0)-434(N) and the selection transistors 438(0)-438(N). As a result, the parasitic resistance and capacitance are canceled such that the comparator circuit 442 has a larger sensing window.

Figure 5A:
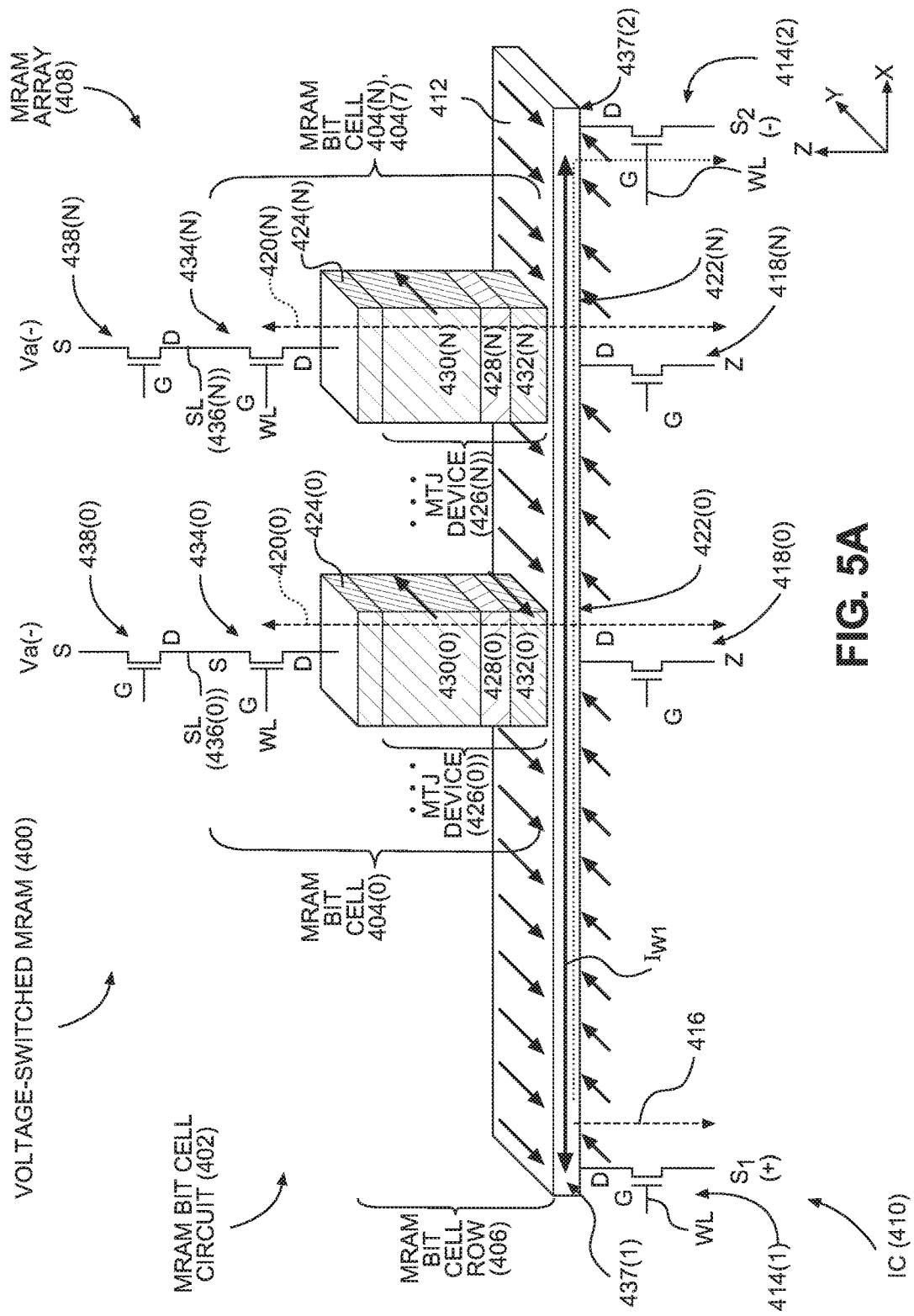
FIG. 5A illustrates an exemplary anti-parallel (AP) magnetic orientation write operation to an MRAM bit cell in the voltage-switched MRAM in FIG. 4A.

More detail regarding write and read operations will now be discussed. As shown in FIG. 5A, to write a logical '1' to the MRAM bit cells 404(0)-404(N), the gates G of the first and second write operation transistors 414(1), 414(2) are activated to turn on the first and second write operation transistors 414(1), 414(2). A positive supply voltage is applied to a source $S_1$ of the first write operation transistor 414(1), and a negative or zero supply voltage is applied to a source $S_2$ of the second write operation transistor 414(2) to cause a first write current $I_{w1}$ to flow from left to right through the common electrode 412. A high impedance is presented to the sources S of the read operation transistors 418(0)-418(N) so that the read operation circuit paths 420(0)-420(N) are not created, and current instead flows between the first and second write operation transistors 414(1), 414(2). The first write current $I_{w1}$ flowing from left to right through the common electrode 412 creates a spin torque in a first Y-axis direction on the free layers 432(0)-432(N) of the MTJ devices 426(0)-426(N). With the first and second write operation transistors 414(1), 414(2) activated, a negative activation voltage Va is applied to the selection transistors 438(0)-438(N) with the access transistors 434(0)-434(N) activated to apply the negative activation voltage Va to the second electrodes 424(0)-424(N) of the MRAM bit cells 404(0)-404(N). High resistance tunnel barriers 428(0)-428(N) reduce current flowing through the tunnel barriers 428(0)-428(N) when switching the magnetic orientation of the MTJ devices 426(0)-426(N). In this example, a SOT is applied to the free layers 432(0)-432(N) by the spin torque induced by the first write current $I_{w1}$ while the first write current $I_{w1}$ is flowing from left to right through the common electrode 412. Applying the negative activation voltage Va to the second electrodes 424(0)-424(N) of the MRAM bit cells 404(0)-404(N) also lowers the energy barrier of the MTJ devices 426(0)-426(N) by a voltage-control-magnetic-anisotropy (VCMA) effect requiring less first write current $I_{w1}$ to change the magnetization orientation of the free layers 432(0)-432(N). By lowering the energy barrier of the MTJ devices 426(0)-426(N) during a write operation, an external magnetic field is not required to switch the magnetic orientation state of the MTJ devices 426(0)-426(N). In this example, the magnetization orientation of the free layers 432(0)-432(N) is changed to be AP to the magnetization orientation of the pinned layers 430(0)-430(N) to store logical '1' values. If it is desired to not perform a write operation in an MRAM bit cell 404(0)-404(N), a positive deactivation voltage Vda can be applied to the selection transistors 438(0)-438(N) for the MRAM bit cells 404(0)-404(N) to not be written so that the energy barrier of their respective MTJ devices 426(0)-426(N) is not lowered sufficient for the spin torque applied to their free layers 432(0)-432(N) to change their magnetic moment orientation.

Figure 5B:
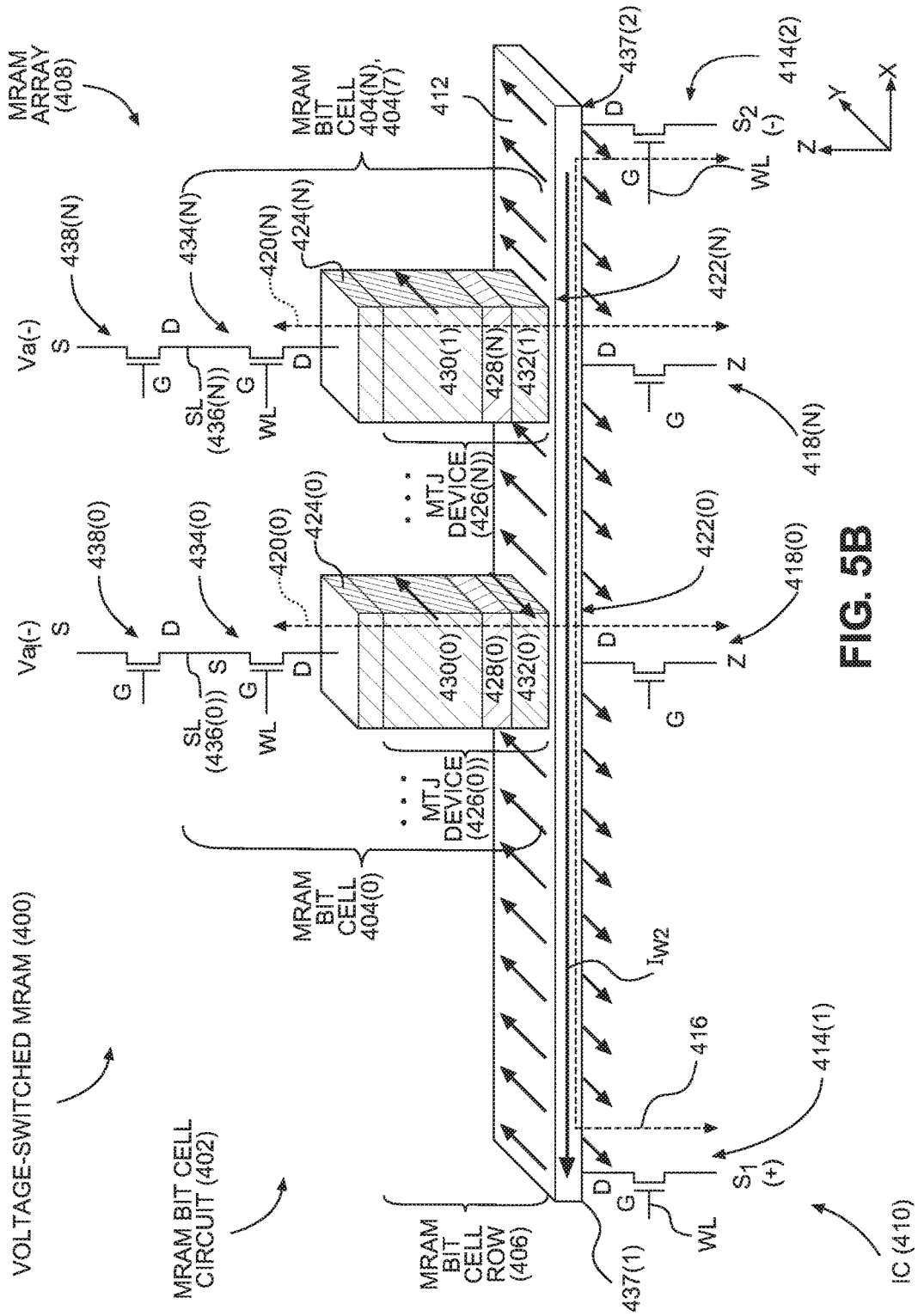
FIG. 5B illustrates an exemplary parallel (P) magnetic orientation write operation to an MRAM bit cell in the voltage-switched MRAM in FIG. 4A.

As shown in FIG. 5B, to write a logical '0' to the MRAM bit cells 404(0)-404(N), the gates G of the first and second write operation transistors 414(1), 414(2) are activated to turn on the first and second write operation transistors 414(1), 414(2). A negative or zero supply voltage is applied to a source $S_1$ of the first write operation transistor 414(1), and a positive supply voltage is applied to a source $S_2$ of the second write operation transistors 414(2) to cause a second write current $I_{w2}$ to flow from right to left through the common electrode 412. A high impedance is presented to the sources S of the read operation transistors 418(0)-418(N) so that the read operation circuit paths 420(0)-420(N) are not created, and current instead flows between the first and second write operation transistors 414(1), 414(2). The second write current $I_{w2}$ flowing from right to left through the common electrode 412 creates a spin torque in a second Y-axis direction on the free layers 432(0)-432(N) of the MTJ devices 426(0)-426(N). The first and second write operation transistors 414(1), 414(2) are activated, and a negative activation voltage Va is applied to the selection transistors 438(0)-438(N) with the access transistors 434(0)-434(N) activated to apply the negative activation voltage Va to the second electrodes 424(0)-424(N) of the MRAM bit cells 404(0)-404(N). High resistance tunnel barriers 428(0)-428 (N) reduce current flowing through the tunnel barriers 428(0)-428(N) when switching the magnetic orientation of the MTJ devices 426(0)-426(N). In this example, a SOT is applied to the free layers 432(0)-432(N) by the spin torque induced by the second write current $I_{w2}$ while the second write current $I_{w2}$ is flowing from right to left through the common electrode 412. Applying the negative activation voltage Va to the second electrodes 424(0)-424(N) of the MRAM bit cells 404(0)-404(N) lowers the energy barrier of the MTJ devices 426(0)-426(N) by a voltage-control-magnetic-anisotropy (VCMA) effect requiring less second write current $I_{w2}$ to change the magnetization orientation of the free layers 432(0)-432(N). By lowering the energy barrier of the MTJ devices 426(0)-426(N) during a write operation, an external magnetic field is not required to switch the magnetic orientation state of the MTJ devices 426(0)-3426(N). In this example, the magnetization orientation of the free layers 432(0)-432(N) is changed to be P to the magnetization orientation of the pinned layers 430(0)-430(N) to store logical '0' values. If it is desired to not perform a write operation in an MRAM bit cell 404(0)-404(N), a positive deactivation voltage Vda can be applied to the selection transistors 438(0)-438(N) for the MRAM bit cells 404(0)-404(N) to not be written so that the energy barrier of their respective MTJ devices 426(0)-426(N) is not lowered sufficient for the spin torque applied to their free layers 432(0)-432(N) to change their magnetic moment orientation.

Note that if desired, a negative activation voltage Va may be applied to each of the MRAM bit cells 404(0)-404(N) for each to be written to a logical '0' value during a write initialization stage so that only the MRAM bit cells 404(0)-404(N) need to be written to a logical '1' in a subsequent write data stage. This heightens the energy barrier of the MTJ devices 426(0)-426(N) that are not to be written so that the spin torque applied on the free layers 432(0)-432(N) when the first write current $I_{w1}$ flows from left to right through the common electrode 412 is not sufficient to change the magnetic orientation direction of those free layers 432(0)-432(N).

Providing the common electrode 412 design in the voltage-switched MRAM 400 in FIGS. 4A and 4B reduces power consumption for write operations. The application of the negative activation voltage Va to the MRAM bit cells 404(0)-404(N) during write operations to reduce the energy barrier of the MTJ devices 426(0)-426(N) of the MRAM bit cell 404(0)-404(N) allows less write currents $I_{w1}$, $I_{w2}$ to be applied to the common electrode 412 through the first and second write operation transistors 414(1), 414(2) to effectuate magnetic orientation direction changes in the MRAM bit cell 404(0)-404(N). Also, as a result of reducing the energy barrier of the MTJ device 426(0)-426(N) in the MRAM bit cell 404(0)-404(N) during a write operation, current switching may be faster in the voltage-switched MRAM 400 than in traditional MRAM designs. Providing the common electrode 412 design also allows two (2) transistors, the first and second write operation transistors 414(1), 414(2) to control providing write current $I_w$ to create the spin torque on the MRAM bit cell 404(0)-404(N), as opposed to providing a dedicated write operation transistor for every MRAM bit cell 404(0)-404(N). Thus, the layout and density of MRAM bit cells 404(0)-404(N) is not dependent on the layout of the first and second write operation transistors 414(1), 414(2). Further, because the energy barrier of the MTJ devices 426(0)-426(N) of the MRAM bit cell 404(0)-404(N) is lowered during write operations, the first and second write operation transistors 414(1), 414(2) may be sized smaller since less drive strength is required for write operations over conventional MRAM designs. The high resistance tunnel barriers 428(0)-428(N) reduce current flowing through the tunnel barriers 428(0)-428(N) during write operations.

Figure 6:
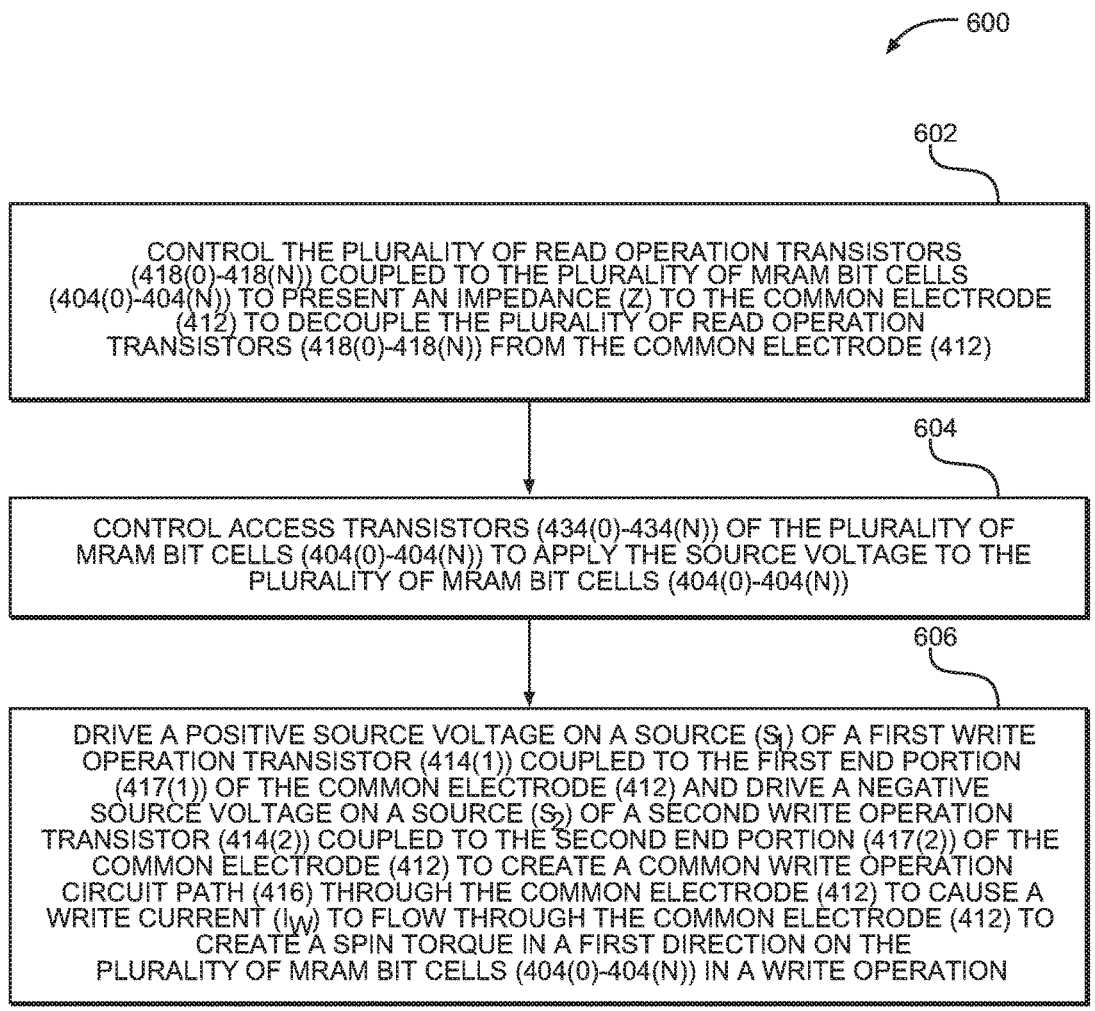
FIG. 6 is a flowchart illustrating an exemplary process of performing a write operation to an MRAM bit cell in the voltage-switched MRAM in FIG. 4A.

FIG. 6 is a flowchart illustrating an exemplary process 600 of performing a write operation to MRAM bit cells 404(0)-404(N) in the voltage-switched MRAM 400 in FIG. 4A according to the discussion above in FIGS. 5A and 5B. In this regard, the process 600 includes controlling the plurality of read operation transistors 418(0)-418(N) coupled to the plurality of MRAM bit cells 404(0)-404(N) to present an impedance Z to the common electrode 412 to decouple the plurality of read operation transistors 418(0)-418(N) from the common electrode 412 (block 602). As previously discussed, this prevents the read operation circuit path 420(0)-420(N) from being created. The process 600 also includes controlling the access transistors 434(0)-434(N) of the plurality of MRAM bit cells 404(0)-404(N) to apply the source voltage to the plurality of MRAM bit cells 404(0)-404(N) (block 604). The process 600 also includes driving a positive source voltage on a source $S_1$ of a first write operation transistor 414(1) and driving a negative or zero source voltage on a source $S_2$ of a second write operation transistor 414(2) to create a common write operation circuit path 416 through the common electrode 412 to cause a write current $I_w$ to flow through the common electrode 412 to create and apply a spin torque in a first direction on the plurality of MRAM bit cells 404(0)-404(N) in a write operation (block 606). As previously discussed, applying the spin torque on the plurality of MRAM bit cells 404(0)-404(N) can change the magnetic orientation direction of their free layers 432(0)-432(0) to effective write a logical state to the MRAM bit cells 404(0)-404(N). Applying a negative activation voltage Va to the MRAM bit cells 404(0)-404(N) during write operations to reduce the energy barrier of the MTJ devices 426(0)-426(N) of the MRAM bit cells 404(0)-404(N) allows less write current $I_{w1}$, $I_{w2}$ to be applied to the common electrode 412.

Figure 7:
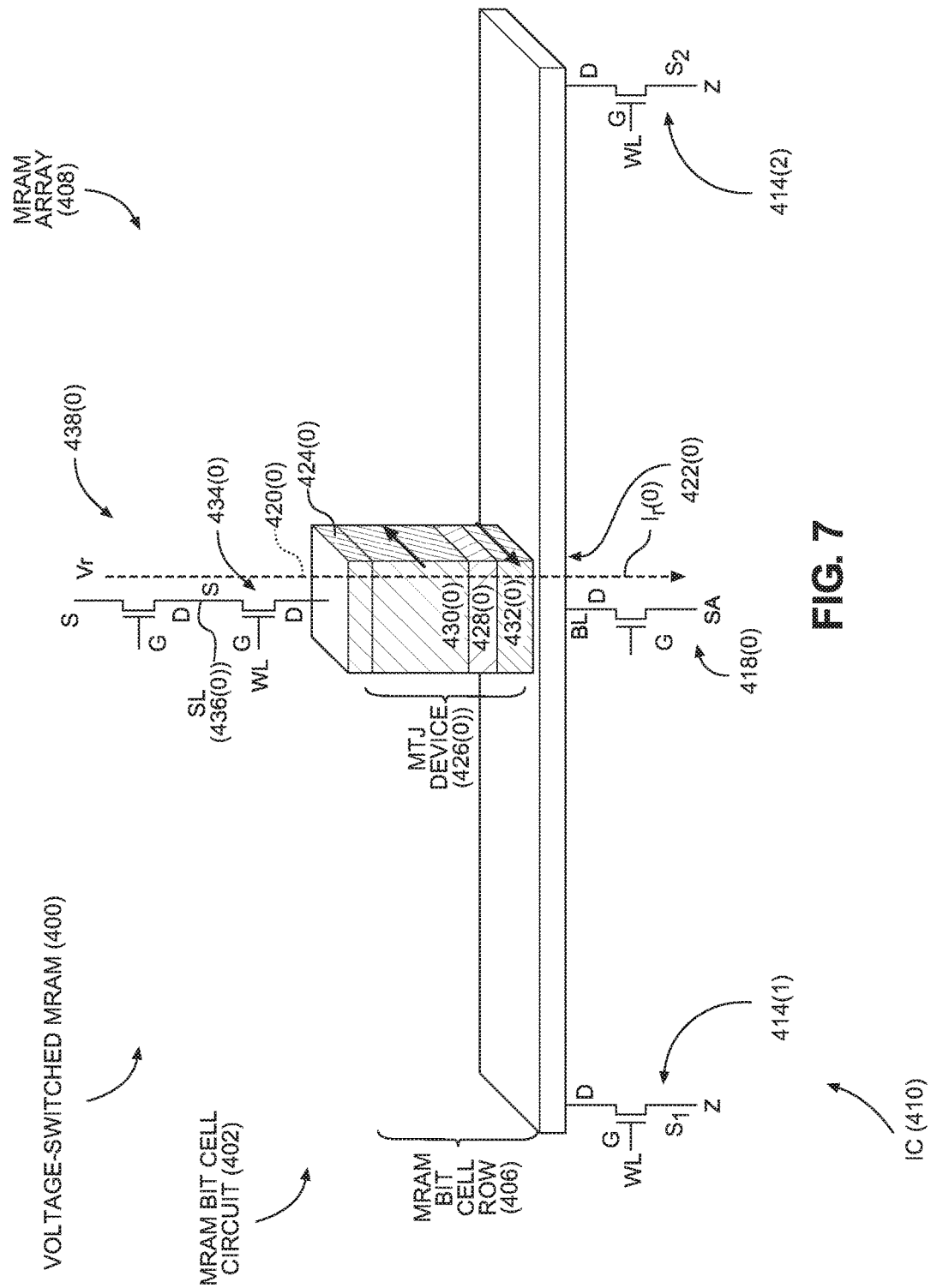
FIG. 7 illustrates an exemplary read operation to an MRAM bit cell in the voltage-switched MRAM in FIG. 4A.

FIG. 7 illustrates a read operation for one MRAM bit cell 404(0) in the voltage-switched MRAM 400 in FIGS. 4A and 4B. In this regard, a positive voltage $V_r$ is applied to the source S of the selection transistor 438(0) associated with the MRAM bit cell 404(0). The respective access transistor 434(0) of the MRAM bit cell 404(0) is activated to apply the positive voltage to a respective MTJ device 426(0). The read operation transistor 418(0) is activated to provide the read operation circuit path 420(0) to the MRAM bit cell 404(0). The write operation transistors 414(1), 414(2) are controlled to provide a high impedance Z to the common electrode 412 so that current does not flow through the common electrode 412 to the write operation transistors 414(1), 414(2) to form the write operation circuit path 416. The positive voltage applied to the MRAM bit cell 404(0) with the read operation circuit path 420(0) created by the read operation transistor 418(0) activated causes the read current $I_r$ to flow through the MTJ device 426(0). As previously discussed, the read current $I_r$ can be sensed to determine the logical state stored in the MRAM bit cell 404(0), because the read current $I_r$ will be a function of the resistance of the MTJ device 426(0), which varies based on whether the MTJ device 426(0) is in a P or AP magnetization state.

Thus, as discussed above with regard to FIG. 7, for read operations, because of the read operation transistors 418(0)-418(N) providing separate read operation circuit paths 420(0)-420(N) for the read current $I_{r(0)}$-$I_{r(N)}$ to flow separate from the write operation circuit path 416, the read operation circuit paths 420(0)-420(N) do not vary in path length. This is because even though the MRAM bit cells 404(0)-404(N) are disposed in different locations along the X-axis direction of the common electrode 412, the common electrode 412 (the portions not attributed to the first electrodes 422(0)-422 (N) of the MRAM bit cells 404(0)-404(N)) does not form the read operation circuit paths 420(0)-420(N). Thus, for example, the read currents $I_{r(0)}$-$I_{r(N)}$ flowing through MRAM bit cells 404(0)-404(N) will travel the same distances each time as part of their formed read operation circuit paths 420(0)-420(N) when the MRAM bit cell 404 (0)-404(N) is read in a read operation. Thus, the parasitic resistance attributed to the common electrode 322 does not affect the read resistance coupled to the MRAM bit cells 404(0)-404(N). This may allow the reading sensing window for the MRAM bit cells 404(0)-404(N) to be enlarged over the VoCSM 302 in FIG. 3A as an example. Also, the read parasitic resistance may be lower as compared to the VoCSM 302 in FIG. 3A for example, to not degrade the TMR ratio of the MTJ devices 426(0)-426(N) of MRAM bit cells 404(0)-404(N) in a read operation, which can affect their performance and sensing margin.

Figure 8:
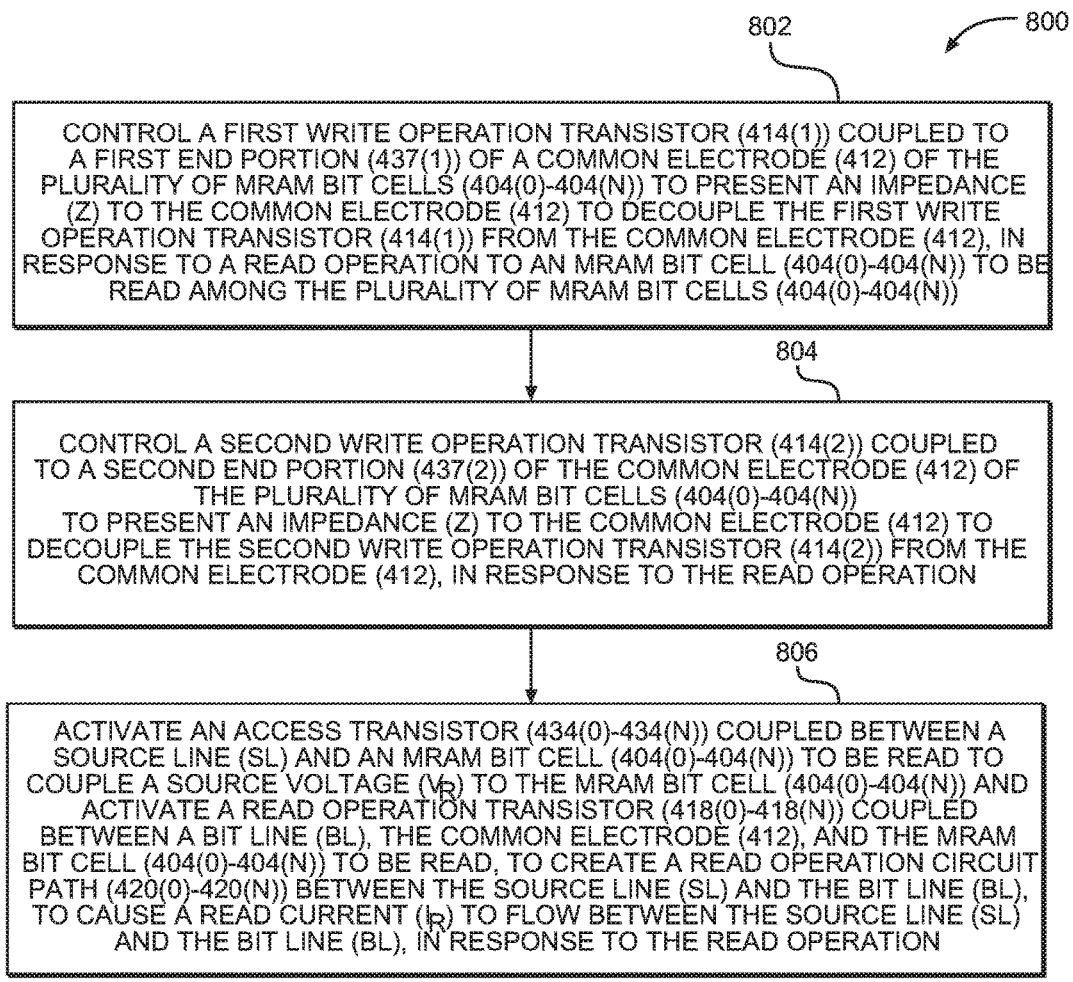
FIG. 8 is a flowchart illustrating an exemplary process of performing a read operation to an MRAM bit cell in the voltage-switched MRAM in FIG. 4A.

FIG. 8 is a flowchart illustrating an exemplary process 800 of performing a write operation to an MRAM bit cell 404(0)-404(N) in the voltage-switched MRAM 400 in FIG. 4A according to the discussion above in FIG. 7. In this regard, the process 800 includes controlling a first write operation transistor 414(1) coupled to a first end portion 437(1) of a common electrode 412 of the plurality of MRAM bit cells 404(0)-404(N) to present a high impedance Z to the common electrode 412 to decouple the first write operation transistor 414(1) from the common electrode 412, in response to a read operation to an MRAM bit cell 404(0)-404(N) to be read among the plurality of MRAM bit cells 404(0)-404(N) (block 802). The process 800 also includes controlling a second write operation transistor (414(2)) coupled to a second end portion 437(2) of the common electrode 412 of the plurality of MRAM bit cells 404(0)-404(N) to present an impedance Z to the common electrode 412 to decouple the second write operation transistor 414(2) from the common electrode 412, in response to the read operation (block 804). As previously discussed, the first and second write operation transistors 414(1), 414(2) presenting the high impedance Z to the common electrode 412 prevents the write operation circuit path 416 from being created. The process 800 also includes activating an access transistor 434(0)-434(N) coupled between a source line (SL) and an MRAM bit cell 404(0)-404(N) to be read to couple a source voltage ($V_R$) to the MRAM bit cell 404(0)-404(N) and activating a read operation transistor 418(0)-418(N) coupled between a bit line (BL), the common electrode 412, and the MRAM bit cell 404(0)-404(N) to be read, to create a read operation circuit path 420(0)-420(N) between the source line (SL) and the bit line (BL) (block 806). This causes the read current ($I_r$) to flow between the source line (SL) and the bit line (BL), in response to the read operation. As previously discussed, the read current ($I_r$) can be sensed to determine the magnetic orientation direction of the free layer 432(0)-432(N) of the MRAM bit cell 404(0)-404(N) to be read, and thus its logical storage state.

Figure 9:
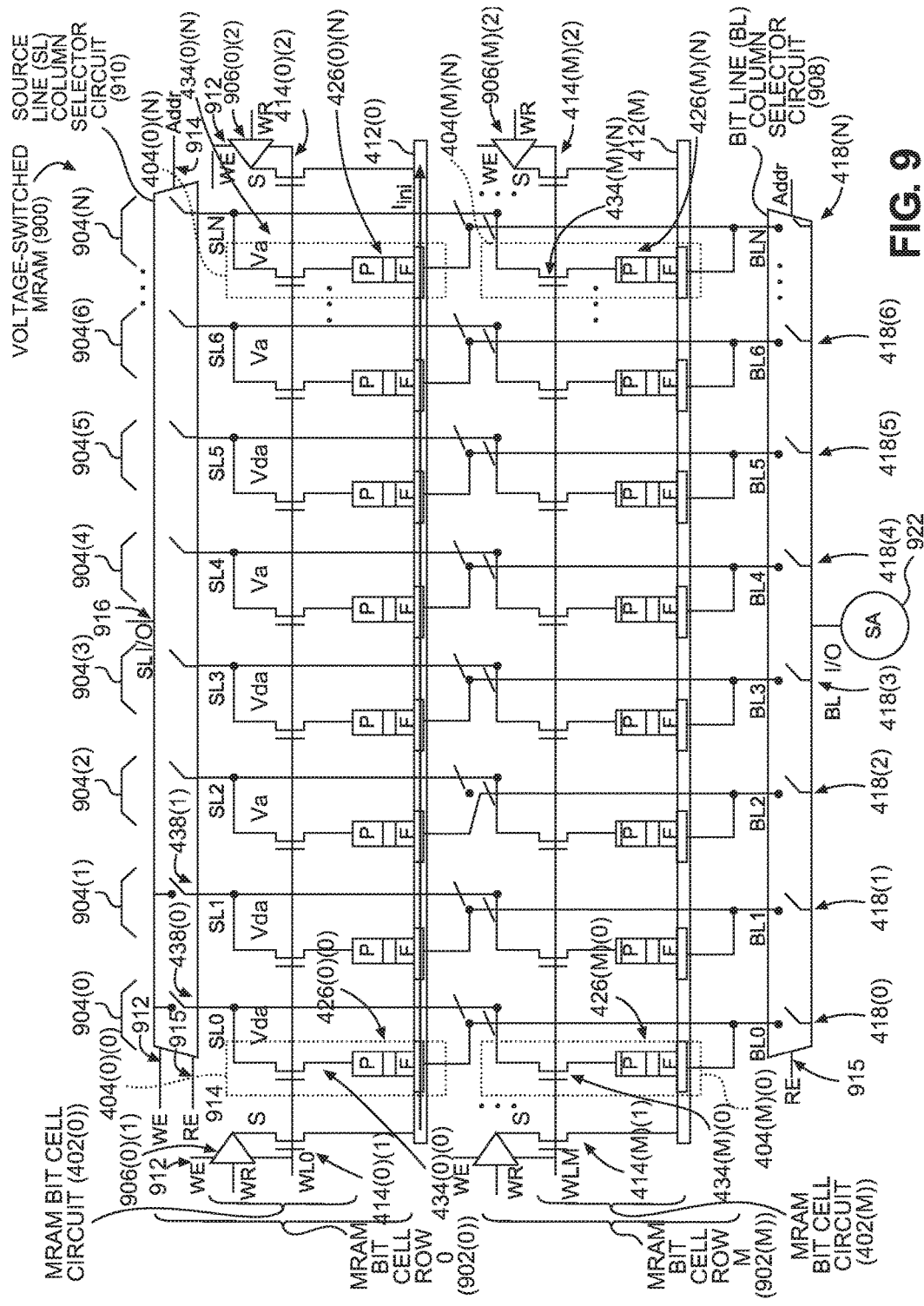
FIG. 9 illustrates an exemplary write operation to an MRAM bit cell in a selected MRAM bit cell row in a voltage-switched MRAM employing the MRAM bit cell circuit in FIG. 4A.

The MRAM bit cell circuit 402 in FIGS. 4A and 4B can be provided in multiple MRAM bit cell rows in an MRAM array to provide a voltage-switched MRAM. In this regard, FIG. 9 illustrates an exemplary voltage-switched MRAM 900 that includes a plurality of MRAM bit cell rows 902 (0)-902(M). Each MRAM bit cell row 902(0)-902(M) includes the MRAM bit cell circuit 402 in FIGS. 4A and 4B and the respective plurality of the MRAM bit cells 404(0) (0)-404(M)(N). For example, MRAM bit cell row 902(0) includes MRAM bit cell circuit 402(0) that includes MRAM bit cells 404(0)(0)-404(0)(N). There are 'N' MRAM bit cell columns 904(0)-904(N). For example, MRAM bit cell column 904(0) includes MRAM bit cells 404 in column 904(0) as MRAM bit cells 404(0)(0)-404(0)(N). MRAM bit cell column 904(N) includes MRAM bit cells 404 in column 904(N) as MRAM bit cells 404(M)(0)-404(M)(N). Each MRAM bit cell row 902(M) includes MRAM bit cell circuit 402(M) that includes MRAM bit cells 404(M)(0)-404(M) (N). Thus, as previously discussed with regard to FIGS. 4A and 4B, each MRAM bit cell row 902(0)-902(M) in the voltage-switched MRAM 900 in FIG. 9 employs a shared, common electrode 412(0)-412(M) coupled to a respective first and second write operation transistor 414(0)(1), 414(0) (2), 414(M)(1), 414(M)(2), for performing write operations to the MRAM bit cells 404(0)(0)-404(M)(N) in their respective MRAM bit cell row 902(0)-902(M). The first and second write operation transistors 414(0)(1), 414(0)(2), 414 (M)(1), 414(M)(2) are gate-coupled to a respective word line $WL_0$-$WL_m$. Driver circuits 906(0)(1), 906(0)(2), 906(M)(1), 906(M)(2) are coupled to each respective first and second write operation transistor 414(0)(1), 414(0)(2), 414(M)(1), 414(M)(2) for controlling the voltage applied to their sources, and thus their common electrodes 412(0)-412(M). Each MRAM bit cell 404(0)(0)-404(M)(N) includes a dedicated access transistor 434(0)(0)-434(M)(N). Each MRAM bit cell row 902(0)-902(M) further employs dedicated read operation transistors 418(0)-418(N) coupled to respective bit lines $BL_0$-$BL_N$ for each MRAM bit cell 404(0)(0)-404 (0)(N), 404(M)(0)-404(M)(N). The read operation transistors 418(0)-418(N) may be provided in a BL column selector circuit 908, which may be a bit line (BL) column multiplexor (mux) circuit for example. Further, each MRAM bit cell row 902(0)-902(M) further employs dedicated selection transistors 438(0)-438(N) coupled to source lines $SL_0$-$SL_N$ for each MRAM bit cell 404(0)(0)-404(0)(N)-404(M)(0)-404(M)(N). The selection transistors 438(0)-438(N) may be provided in a source line (SL) column selector circuit 910, which may be a SL column multiplexor (mux) circuit for example.

With continuing reference to FIG. 9, the driver circuits 906(0)(1), 906(M)(1) each include a write enable input WE and a write voltage rail input WR. Driver circuits 906(0)(2), 906(M)(2) also include a write enable input WE and a write voltage rail input WR. For example, in an exemplary write operation to the first MRAM bit cell row 902(0) shown in FIG. 9, the word line $WL_0$ is activated to activate the first and second write operation transistors 414(0)(1), 414(0)(2) in the MRAM bit cell row 902(0) and the access transistors 434(0)(0)-434(0)(N). A positive voltage is applied to the write voltage rail input WR of the driver circuit 906(0)(1), and a negative or zero voltage is on the write voltage rail input WR to driver circuit 906(0)(2). A write enable signal 912 of a write enable state is applied to the write enable inputs WE of the driver circuits 906(0)(1), 906(0)(2). This causes the driver circuit 906(0)(1) to apply the positive voltage to the common electrode 412(0) and the driver circuit 906(0)(2) to apply the negative voltage to the common electrode 412(0) to drive first write current $I_{w1}$ to flow through the common electrode 412(0), as shown in FIG. 9. A high impedance Z is presented by the read operation transistors 418(1)-418(N) to not create read operation circuit paths 420(0)-420(N) through the BL column selector circuit 908 in response to a read enable signal of a read enable state input to the read enable input RE. As previously discussed, first write current $I_{w1}$ flowing through the common electrode 412(0) creates a spin torque on the MTJ devices 426(0)(0)-426(0)(N) in the MRAM bit cell row 902(0). The first write current $I_{w1}$ creates a spin torque to allow a logical '1' to be written to the MRAM bit cells 404(0)(0)-404(0)(N). As shown in the example of FIG. 9, to perform a write operation on a given MRAM bit cell 404(0)(0)-404(0(N), activation voltages $V_a$ are applied to lower the energy barrier to allow the magnetization orientation direction to be changed in the respective MTJ device 426(0)(0)-426(0)(N). Deactivation voltages $V_{da}$ are applied to MRAM bit cells 404(0)(0)-404(0(N) that are not to be written. The SL column selector circuit 910 is configured to activate the selection transistors 438(0)-438(N) to apply either the activation voltages $V_a$ or deactivation voltages $V_{da}$ based on a memory address 914 provided to a memory address input Addr and the write enable signal 912 of a write enable state provided on a write enable input WE of the SL column selector circuit 910. The data to be written is based on data provided on a SL I/O to the SL column selector circuit 910.

To create the second write current $I_{w2}$ to flow in the opposite direction to write logical '0' values to MRAM bit cells 404(0)(0)-404(0)(N) in the MRAM bit cell row 902(2), a negative or zero voltage and a positive voltage are applied to the write voltage rail inputs WR of the respective driver circuits 906(0)(1), 906(0)(2). The write enable signal 912 of a write enable state is applied the driver circuits 906(0)(1), 906(0)(2). This causes the driver circuit 906(0)(1) to apply a negative or zero voltage to the first write operation transistor 414(0)(1) and the driver circuit 906(0)(2) to apply a positive voltage to the second write operation transistor 414(0)(2). Again, activation negative voltages $V_a$ are applied to lower the energy barrier to allow the magnetization orientation direction to be changed in the respective MTJ device 426(0)(0)-426(0)(N). Deactivation voltages $V_{da}$ are applied to MRAM bit cell 404(0)(0)-404(0)(N) that are not to be written. The SL column selector circuit 910 is configured to activate the selection transistors 438(0)-438(N) to apply either the activation voltages $V_a$ or deactivation voltages $V_{da}$ based on the memory address 914 provided to a memory address input Addr and the write enable signal 912 of a write enable state provided on a write enable input WE of the SL column selector circuit 910. The data to be written is based on the data 918 provided on a SL I/O to the SL column selector circuit 910.

Figure 10:
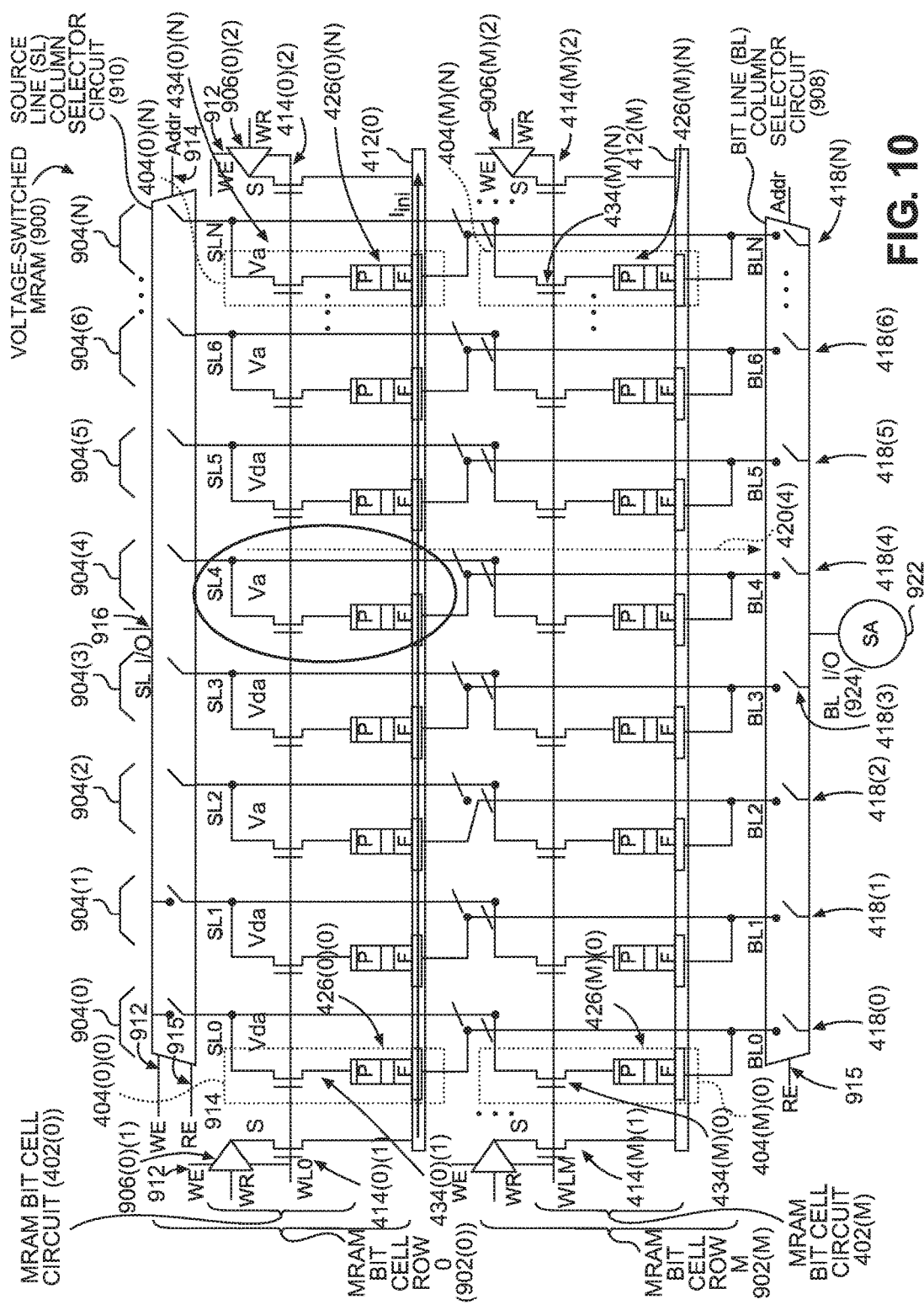
FIG. 10 illustrates an exemplary read operation to an MRAM bit cell in the voltage-switched MRAM in FIG. 9.

FIG. 10 illustrates a read operation on MRAM bit cell 404(0)(4) in MRAM bit cell row 902(0) in the voltage-switched MRAM 900 in FIG. 9. In this example, the word line $WL_0$ is again activated to activate the access transistors 434(0)(0)-434(0)(N), and the first and second write operation transistors 414(0)(1), 414(0)(2) in the MRAM bit cell row 902(0). The write enable signal 912 of a write disable state is applied to the driver circuit 906(0)(1), 906(0)(2), which causes the first and second write operation transistors 414(0)(1), 414(0)(2) to present a high impedance Z to the common electrode 412(0). This is so the common electrode 412(0) will not form the read operation circuit path 420(0)-420(N) for the read operation to the MRAM bit cell 404(0)(4). The write enable signal 912 of a write disable state also causes the SL column selector circuit 910 to not activate all of the selection transistors 438(0)-438(N). A read enable signal 915 of a read enable state is applied to a read enable input RE of the SL column selector circuit 910 to activate the selection transistor 438(4) to apply the read voltage $V_r$ to the MRAM bit cell 404(0)(4). The read enable signal 915 of a read enable state is also applied to a read enable input RE of the BL column selector circuit 908 to activate the read operation transistor 418(4) to create a read operation circuit path 420(4) to a sense amplifier 922 through a BL I/O output 924.

Figure 11:
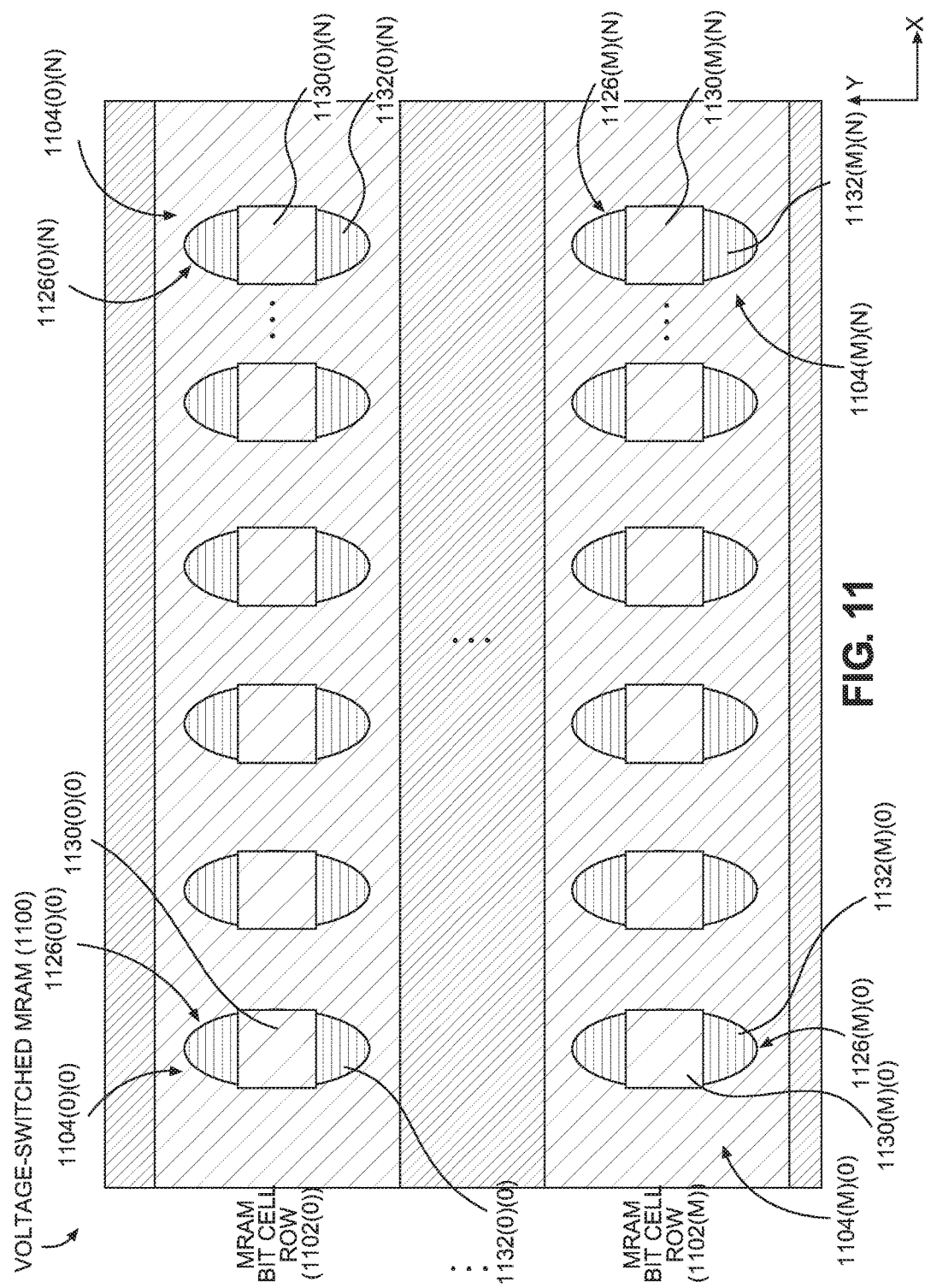
FIG. 11 is a top view diagram of exemplary MRAM bit cell rows that can be provided in the voltage-switched MRAM in FIG. 4A, wherein each MRAM bit cell row employs in-plane MTJ (iMTJ) devices in the MRAM bit cells therein.
Figure 12:
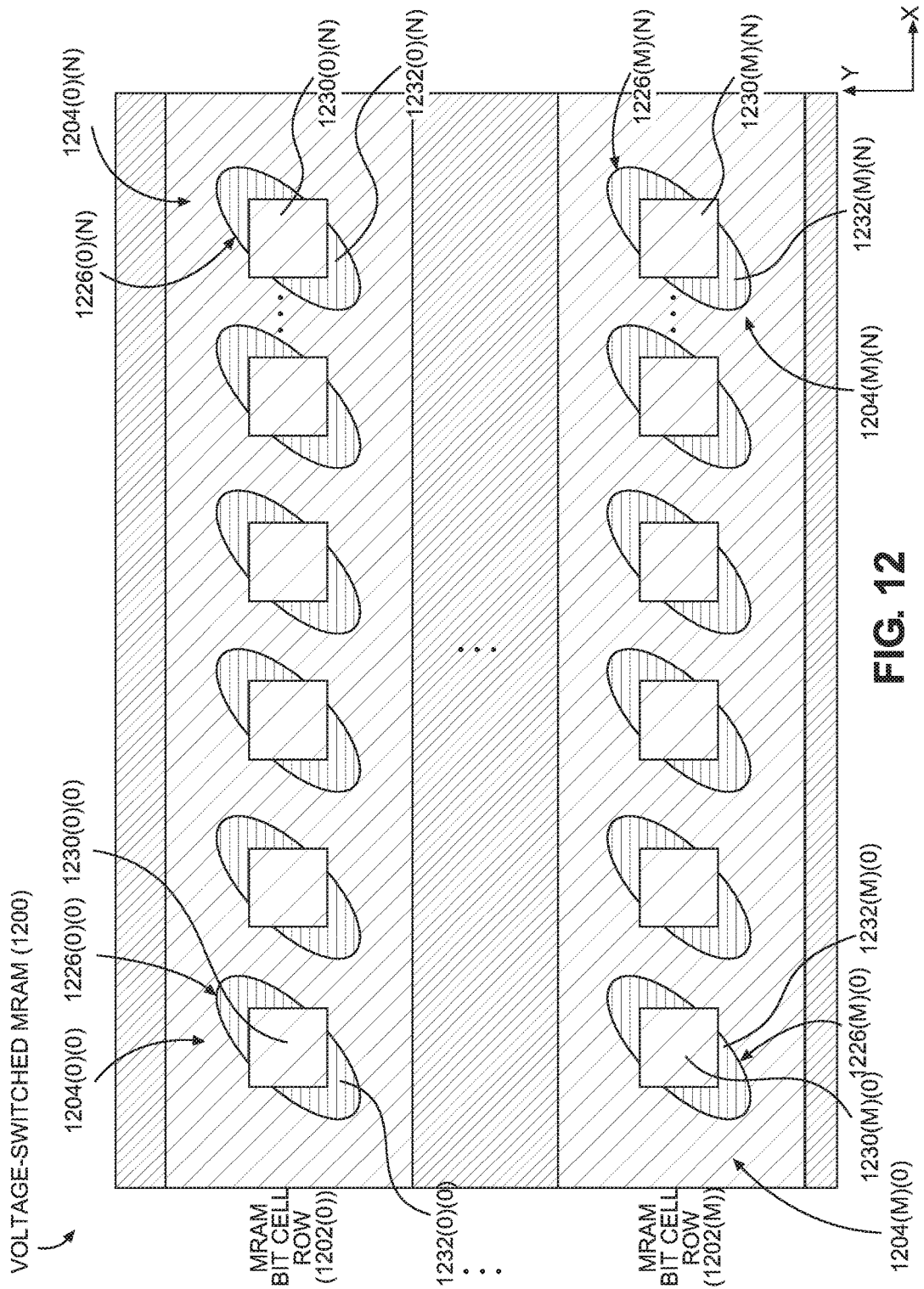
FIG. 12 is a top view diagram of exemplary MRAM bit cell rows that can be provided in the voltage-switched MRAM in FIG. 4A, wherein each MRAM bit cell row employs perpendicular MTJ (pMTJ) devices in the MRAM bit cells therein.
Figure 13:
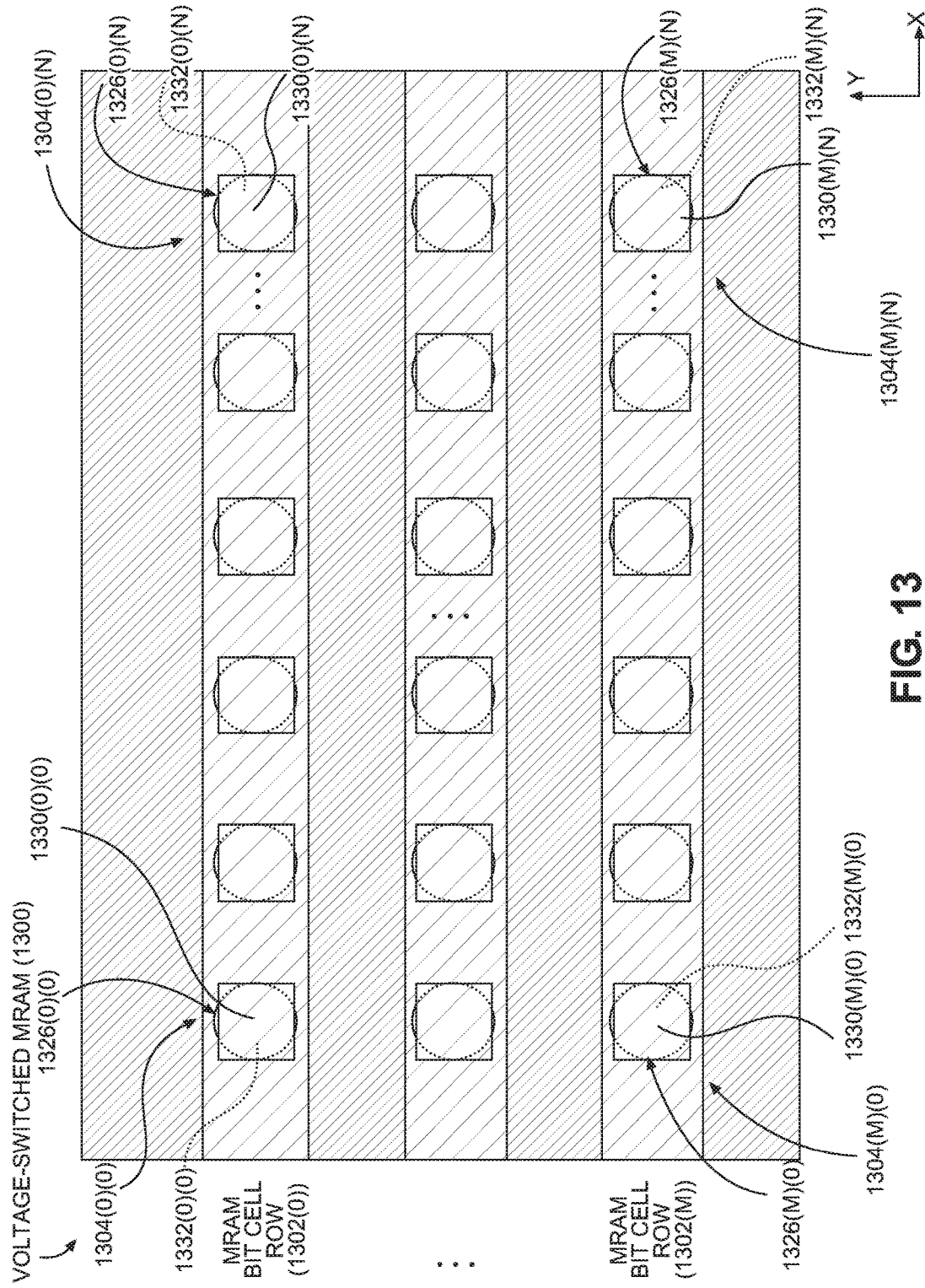
FIG. 13 is a top view diagram of alternative exemplary MRAM bit cell rows that can be provided in the voltage-switched MRAM in FIG. 4A, wherein each MRAM bit cell row employs pMTJ devices in the MRAM bit cells therein.

The MTJ devices 926(0)(0)-926(M)(N) of the MRAM bit cells 404(0)(0)-404(M)(N) in the voltage-switched MRAM 900 in FIG. 9 can be provided as iMTJs or perpendicular MTJs (pMTJs). For iMTJs, the magnetic orientation direction of the free layer is changed in the in-plane direction, which is the in-plane Y-axis direction shown in FIGS. 9 and 10. For pMTJs, the magnetic orientation direction of the free layer is changed in the perpendicular direction, which is in the Z-axis direction shown in FIGS. 9 and 10. In this regard, FIG. 11A is a top view diagram of an exemplary voltage-switched MRAM 1100 that includes MRAM bit cell rows 1102(0)-1102(M) each including MRAM bit cells 1104(0)(0)-1104(0)(N)-1104(M)(0)-1104(M)(N) that include iMTJ devices 1126(0)(0)-1126(0)(N)-1126(M)(0)-1126(M)(N) with the easy axis of the free layers 1132(0)(0)-1132(0)(N)-1132(M)(0)-1132(M)(N) below their respective pinned layers 1130(0)(0)-1130(0)(N)-1130(M)(0)-1130(M)(N) and elongated in the Y-axis direction. The pinned layers 1130(0)(0)-1130(0)(N)-1130(M)(0)-1130(M)(N) are top via or metal pinned layers configured to connect the iMTJ devices 1126(0)(0)-1126(0)(N)-1126(M)(0)-1126(M)(N). FIG. 12 is a top view diagram of an exemplary voltage-switched MRAM 1200 that includes MRAM bit cell rows 1202(0)-1202(M) each including MRAM bit cells 1204(0)(0)-1204(0)(N)-1204(M)(0)-1204(M)(N) that include iMTJ devices 1226(0)(0)-1226(0)(N)-1226(M)(0)-1226(M)(N) with the easy axis of the free layers 1232(0)(0)-1232(0)(N)-1232(M)(0)-1232(M)(N) below their respective pinned layers 1230(0)(0)-1230(0)(N)-1230(M)(0)-1230(M)(N) and elongated in an approximate 45 degree angle of the X- and Y-axis directions. The pinned layers 1230(0)(0)-1230(0)(N)-1230(M)(0)-1230(M)(N) are top via or metal pinned layers configured to connect the iMTJ devices 1226(0)(0)-1226(0)(N)-1226(M)(0)-1226(M)(N). FIG. 13 is a top view diagram of an exemplary voltage-switched MRAM 1300 that includes MRAM bit cell rows 1302(0)-1302(M) each including MRAM bit cells 1304(0)(0)-1304(0)(N)-1304(M)(0)-1304(M)(N) that include pMTJ devices 1326(0)(0)-1326(0)(N)-1326(M)(0)-1326(M)(N) with circular-shaped free layers 1332(0)(0)-1332(0)(N)-1332(M)(0)-1332(M)(N) having a smaller aspect ratio and their respective pinned layers 1330(0)(0)-1330(0)(N)-1330(M)(0)-1330(M)(N). The pinned layers 1330(0)(0)-1330(0)(N)-1330(M)(0)-1330(M)(N) are top via or metal pinned layers configured to connect the pMTJ devices 1326(0)(0)-1326(0)(N)-1326(M)(0)-1326(M)(N). A smaller aspect ratio of the free layer and the pinned layer provides greater magnetic field sensitivity and smaller switching current. The aspect ratio of a free layer to a pinned layer can also compensate for variations in magnetic anisotropy and coercivity due to changes in environmental temperature for example.

The examples of voltage-switched MRAMs thus far have included MRAM bit cells that include top-pinned MTJ devices where the pinned layers are disposed above the free layers, and the common electrode is disposed adjacent to the free layers. It is also possible to provide voltage-switched MRAMs that include MRAM bit cells that include bottom-pinned MTJ devices where the free layers are disposed above the pinned layers, and the common electrode is disposed adjacent to the pinned layers.

Figure 14:
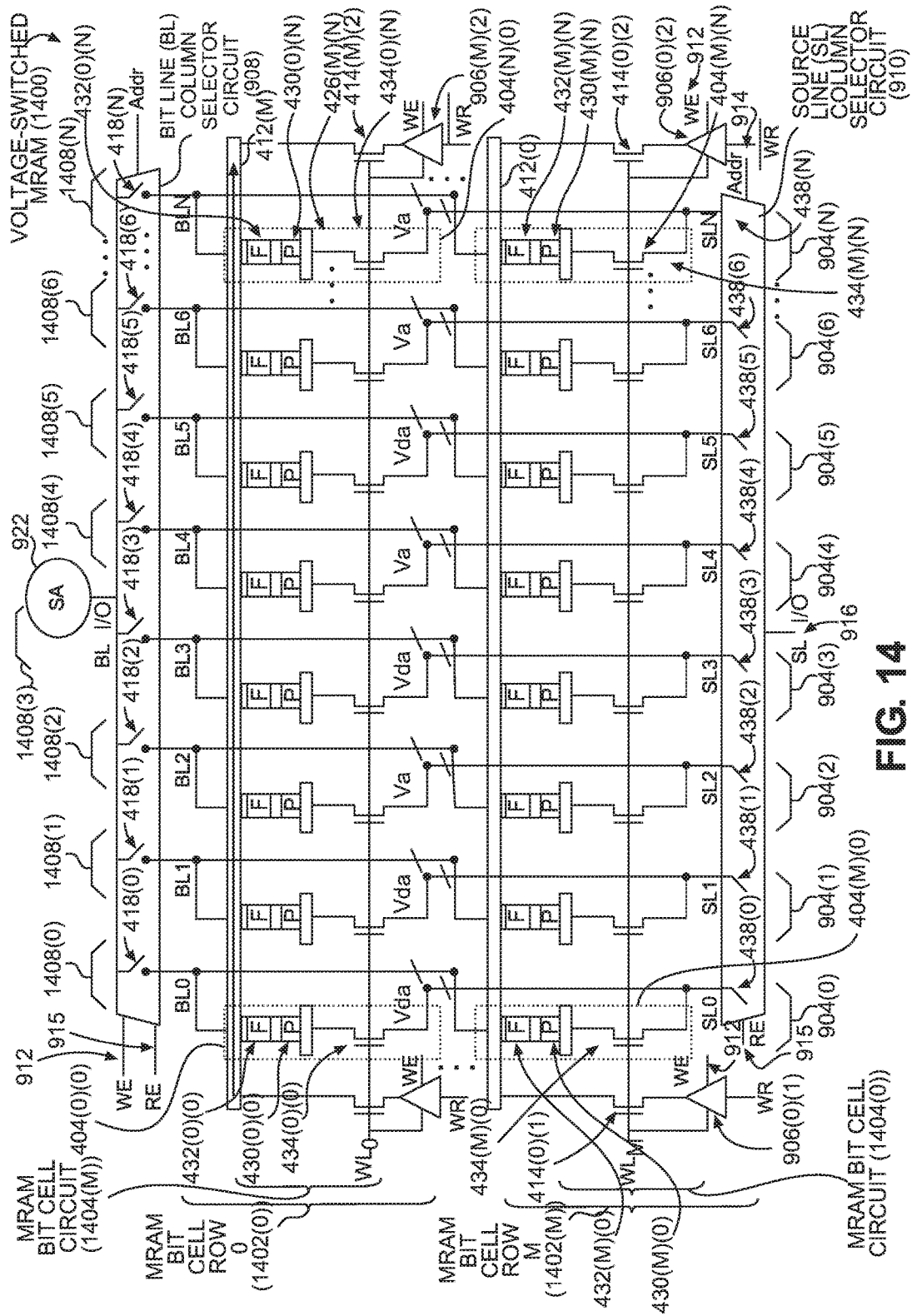
FIG. 14 illustrates another exemplary voltage-switched MRAM illustrating an MRAM bit cell circuit employing multiple MRAM bit cells in a bottom-pinned layout, and with separate read operation circuit paths from a shared spin torque write operation circuit path, and illustrating an exemplary write operation to an MRAM bit cell in a selected MRAM bit cell row.

In this regard, FIG. 14 illustrates an exemplary voltage-switched MRAM 1400 that includes a plurality of MRAM bit cell rows 1402(0)-1402(M). Each MRAM bit cell row 1402(0)-1402(M) includes a respective MRAM bit cell circuit 1404(0)-1404(M) similar to the MRAM bit cell circuit 402 in FIGS. 4A and 4B, except that the MRAM bit cell circuits 1404(0)-1404(M) include respective MRAM bit cells 404(0)(0)-404(M)(N) that are configured in the MRAM bit cell circuits 1404(0)-1404(M) in a bottom-pinned configuration. Common element numbers are used between FIG. 14 and FIG. 9 for common components, and thus will not be re-described. The free layers 432(0)(0)-432(M)(N) of the MRAM bit cells 1406(0)(0)-1406(M)(N) are disposed adjacent to the first electrodes 422(0)-422(N) and the common electrode 412(0)-412(M). The access transistors 434(0)-434(N) are disposed adjacent to the second electrodes 424(0)-424(N) and the pinned layers 430(0)-430(N). For example, MRAM bit cell row 1402(0) includes MRAM bit cell circuit 1404(0) that includes MRAM bit cells 1406(0)(0)-1406(0)(N). There are 'N' MRAM bit cell columns 1408(0)-1408(N). The operation of the voltage-switched MRAM 1400 in FIG. 14 for read and write operations is like that previously discussed for the voltage-switched MRAM 900 in FIGS. 9 and 10 and thus will not be re-described here.

FIGS. 15A-15F illustrate exemplary fabrication stages of a voltage-switched MRAM that employs a shared bottom electrode and shared write operation transistors for each MRAM bit cell row. These fabrication stages can be used to fabricate any of the voltage-switched MRAMs disclosed herein that include a common electrode. The examples in FIGS. 15A-15F are to fabricate an MRAM bit cell 404 like in FIG. 4A. In this regard, FIG. 15A illustrates a first fabrication stage 1500(1) of a voltage-switched MRAM 1502. The first fabrication stage 1500(1) illustrates a metal line 1504 already formed within inter-metal dielectric (IMD) material 1506 at a given metal layer 1508. To prepare for a via to be interconnected to the metal line 1504, a dielectric layer 1510 is disposed above the metal layer 1508. A photolithography process can be used to expose an opening 1512 for a via 1514 to be formed therein, as shown in a second fabrication stage 1500(2) in FIG. 15B. The via 1514 may be polished or processed down to be planar with the dielectric layer 1510 with a planarizing process, as shown in FIG. 15B. A common electrode 412 can then be formed over the dielectric layer 1510 to form an interconnection with the via 1514.

FIG. 15C illustrates a third fabrication stage 1500(3) of the voltage-switched MRAM 1502. As shown therein, the free layer 432, the tunnel barrier 428, and the pinned layer 430 are formed above the common electrode 412 to form an MTJ stack-up 1516 for forming an MTJ device. The common electrode 412 is electrically coupled to the free layer 432. To prepare an MTJ device, a hard mask layer (HM) 1518 is disposed above the MTJ stack-up 1516 to protect the free layer 432, the tunnel barrier 428, and the pinned layer 430 when the MTJ stack-up 1516 is etched, such as through an ion-beam etching (IBE) process for example. A photoresist layer 1520 is disposed over the hard mask (HM) layer 1518 so that portions of the hard mask (HM) layer 1518 not disposed above the MTJ stack-up 1516 can be removed with an etching process to form a hard mask (HM) 1522, as shown in a fourth fabrication stage 1500(4) in FIG. 15D. The MTJ stack-up 1516 is then etched to form the MTJ device 426 in FIG. 15D. Then, as shown in a fifth fabrication stage 1500(5) in FIG. 15E, another IMD layer 1524 is disposed around the MTJ device 426 to provide isolation, to prepare another metal line 1526 in another metal layer 1528 to be coupled to formed above the MTJ device 426 to form a top electrode of an MRAM bit cell 404, as shown in a sixth fabrication stage 1500(6) in FIG. 15F.

Voltage-switched MRAM illustrating an MRAM bit cell row employing multiple MRAM bit cells with separate read operation circuit paths from a shared spin torque write operation circuit path to separate read and write operation circuit paths for reducing parasitic read resistance during read operations and according to aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 16:
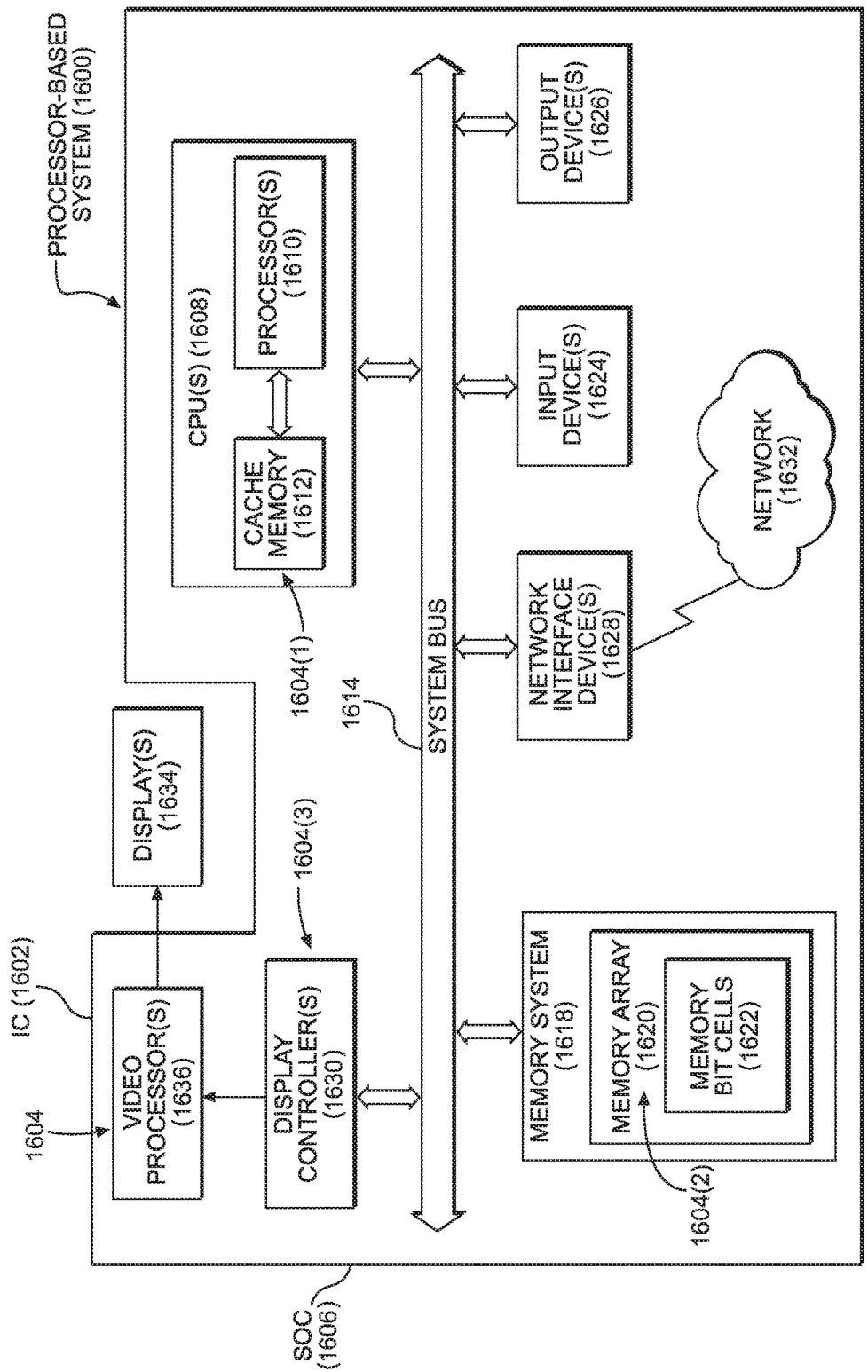
FIG. 16 is a block diagram of an exemplary processor-based system that includes memory systems that can include a voltage-switched MRAM employing a shared bottom electrode and shared write operation transistors, and further employs dedicated read operation transistors for each MRAM bit cell to provide spin torque read paths to separate read and write operation circuit paths, including but not limited to the voltage-switched MRAMs in FIGS. 4A, 8-10, and 12-13.

In this regard, FIG. 16 illustrates an example of a processor-based system 1600 that can be included in an IC 1602. The processor-based system 1600 can include voltage-switched MRAM 1604 that includes MRAM bit cell rows employing multiple MRAM bit cells with separate read operation circuit paths from a shared spin torque write operation circuit path to separate read and write operation circuit paths for reducing parasitic read resistance during read operations and according to aspects disclosed herein, including without limitation the voltage-switched MRAM 400 in FIGS. 4A-4B and the voltage-switched MRAM 1300 in FIGS. 13-14. The IC 1602 may be included in or provided as a SoC 1606. The processor-based system 1600 includes a CPU 1608 that includes one or more processors 1610. The CPU 1608 may have a cache memory 1612 coupled to the processor(s) 1610 for rapid access to temporarily stored data. The cache memory 1612 can include the voltage-switched MRAM 1604(1) that includes MRAM bit cell rows employing multiple MRAM bit cells with separate read operation circuit paths from a shared spin torque write operation circuit path to separate read and write operation circuit paths for reducing parasitic read resistance during read operations, and according to any of the examples disclosed herein. The CPU 1608 is coupled to a system bus 1614 and can intercouple master and slave devices included in the processor-based system 1600. As is well known, the CPU 1608 communicates with these other devices by exchanging address, control, and data information over the system bus 1614. Although not illustrated in FIG. 16, multiple system buses 1614 could be provided, wherein each system bus 1614 constitutes a different fabric. For example, the CPU 1608 can communicate bus transaction requests to a memory system 1618 as an example of a slave device. The memory system 1618 may include a memory array 1620 that includes memory bit cells 1622. The memory bit cells 1622 may be MRAM bit cells for example. The memory array 1620 can include a voltage-switched MRAM 1604(2) that includes MRAM bit cell rows employing multiple MRAM bit cells with separate read operation circuit paths from a shared spin torque write operation circuit path to separate read and write operation circuit paths for reducing parasitic read resistance during read operations, and according to any of the examples disclosed herein.

Other master and slave devices can be connected to the system bus 1614. As illustrated in FIG. 16, these devices can include the memory system 1618, and one or more input devices 1624. The input device(s) 1624 can include any type of input device, including but not limited to input keys, switches, voice processors, etc. The other devices can also include one or more output devices 1626, and one or more network interface devices 1628. The output device(s) 1626 can include any type of output device, including but not limited to audio, video, other visual indicators, etc. The other devices can also include one or more display controllers 1630 as examples. The network interface device(s) 1628 can be any devices configured to allow exchange of data to and from a network 1632. The network 1632 can be any type of network, including but not limited to a wired or wireless network, a private or public network, a local area network (LAN), a wireless local area network (WLAN), a wide area network (WAN), a BLUETOOTH™ network, and the Internet. The network interface device(s) 1628 can be configured to support any type of communications protocol desired.

The CPU 1608 may also be configured to access the display controller(s) 1630 over the system bus 1614 to control information sent to one or more displays 1634. The display controller 1630 can include a voltage-switched MRAM 1604(3) that includes MRAM bit cell rows employing multiple MRAM bit cells with separate read operation circuit paths from a shared spin torque write operation circuit path to separate read and write operation circuit paths for reducing parasitic read resistance during read operations, and according to any of the examples disclosed herein. The display controller(s) 1630 sends information to the display(s) 1634 to be displayed via one or more video processors 1636, which process the information to be displayed into a format suitable for the display(s) 1634. The display(s) 1634 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master devices and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A magneto-resistive random access memory (MRAM) bit cell circuit, comprising:
    a plurality of MRAM bit cells each comprising:
        a first electrode and a second electrode;
        a magnetic tunnel junction (MTJ) device, comprising:
            a tunnel barrier between the first electrode and the second electrode;
            a pinned layer between the tunnel barrier and the second electrode; and
            a free layer between the tunnel barrier and the first electrode; and an access transistor coupled to one of the first electrode or the second electrode;

a common electrode comprising either the first electrodes or the second electrodes of the plurality of MRAM bit cells, the common electrode comprising a first end portion and a second end portion;

a first write operation transistor coupled to the first end portion of the common electrode such that a write current flowing through the first write operation transistor flows through each of the first electrodes or the second electrodes of the common electrode;

a second write operation transistor coupled to the second end portion of the common electrode such that a write current flowing through the second write operation transistor flows through each of the first electrodes or the second electrodes of the common electrode;

the first write operation transistor and the second write operation transistor, when activated, configured to provide a common write operation circuit path through the common electrode for the plurality of MRAM bit cells;

a plurality of read operation transistors each coupled to a respective first electrode or second electrode of an MRAM bit cell among the plurality of MRAM bit cells; and each read operation transistor among the plurality of read operation transistors, when activated, configured to provide a dedicated read operation circuit path for its respective MRAM bit cell, separate from the common write operation circuit path.

2. The MRAM bit cell circuit of claim 1, wherein for each of the plurality of MRAM bit cells, the access transistor comprises:

a gate coupled to a word line (WL);

a drain coupled to the one of the first electrode or the second electrode; and a source configured to be coupled to a source line (SL);

the access transistor configured to apply a source voltage applied to the source line (SL) to the one of the first electrode or the second electrode of its respective MRAM bit cell in response to the gate being activated.

3. The MRAM bit cell circuit of claim 1, wherein:

the first write operation transistor comprises:

a gate coupled to a word line;

a drain coupled to the first end portion of the common electrode; and a source configured to be coupled to a first driver circuit; and the second write operation transistor comprises:

a gate coupled to the word line;

a drain coupled to the second end portion of the common electrode; and a source configured to be coupled to a second driver circuit.

4. The MRAM bit cell circuit of claim 3, wherein a first write current is configured to flow in the common electrode from the first end portion to the second end portion of the common electrode in the common write operation circuit path to create a spin torque in a first direction on the free layer of the MTJ device of the plurality of MRAM bit cells in a first write operation, in response to the first driver circuit driving a positive source voltage on the source of the first write operation transistor and the second driver circuit driving a negative or zero source voltage on the source of the second write operation transistor.

5. The MRAM bit cell circuit of claim 4, wherein:

the access transistor is configured to apply a source voltage applied to a source line (SL) to the one of the first electrode or the second electrode of its respective MRAM bit cell in response to the gate being activated; and in response to the first write operation to an MRAM bit cell among the plurality of MRAM bit cells, a gate of the access transistor of the MRAM bit cell is configured to be activated to apply the source voltage to the one of the first electrode or the second electrode of the MRAM bit cell.

6. The MRAM bit cell circuit of claim 5, wherein, in response to the first write operation to the MRAM bit cell among the plurality of MRAM bit cells, the gate of the access transistor of the MRAM bit cell is configured to be activated to apply a relative negative voltage to the one of the first electrode or the second electrode of the MRAM bit cell to lower an energy barrier of the tunnel barrier of the MTJ device of the MRAM bit cell.

7. The MRAM bit cell circuit of claim 4, wherein a second write current is configured to flow in the common electrode in a second direction from the second end portion to the first end portion of the common electrode in the common write operation circuit path to create a spin torque in the second direction on the free layer of the MTJ device of the plurality of MRAM bit cells in the second write operation, in response to the second driver circuit driving a positive source voltage on the source of the second write operation transistor and the first driver circuit driving a negative or zero source voltage on the source of the first write operation transistor.

8. The MRAM bit cell circuit of claim 4, wherein, in response to the first write operation, sources of a plurality of read access transistors are activated to present an impedance on their dedicated read operation circuit paths to decouple the plurality of read access transistors from the common electrode.

9. The MRAM bit cell circuit of claim 1, wherein each of the plurality of read operation transistors for the plurality of MRAM bit cells each comprise:

a gate coupled to a read enable line;

a drain coupled to the one of the first electrode or the second electrode of the MRAM bit cell; and a source coupled to a dedicated bit line (BL).

10. The MRAM bit cell circuit of claim 9, wherein a read current is configured to flow in an MTJ of an MRAM bit cell among the plurality of MRAM bit cells to the dedicated bit line (BL) of the MRAM bit cell in the read operation circuit path for the MRAM bit cell, in response to the gate being activated by a read enable signal in a read enable state asserted on the read enable line for a read operation.

11. The MRAM bit cell circuit of claim 9, further comprising a bit line (BL) column selector circuit comprising:

the plurality of read operation transistors;

a plurality of dedicated bit lines (BL) coupled to respective sources of the plurality of read operation transistors;

a read enable input coupled to the read enable line; and a memory address input configured to receive a memory address for a read operation.

12. The MRAM bit cell circuit of claim 11, wherein the bit line (BL) column selector circuit is configured to activate a read operation transistor among the plurality of read operation transistors to couple a respective dedicated bit line (BL) among the plurality of dedicated bit lines (BL) to a source of an activated read operation transistor, to create a read operation circuit path between the MRAM bit cell among the plurality of MRAM bit cells coupled to the read operation transistor and the respective dedicated bit line (BL) based on the received memory address, in response to a read enable signal in a read enable state asserted on the read enable input.

13. The MRAM bit cell circuit of claim 1, wherein:
the common electrode comprises first electrodes of the plurality of MRAM bit cells;
the first write operation transistor is coupled to the first end portion of the common electrode such that the write current flowing through the first write operation transistor flows through each of the first electrodes of the common electrode;
the second write operation transistor is coupled to the second end portion of the common electrode such that the write current flowing through the second write operation transistor flows through each of the first electrodes of the common electrode; and
each access transistor of the plurality of MRAM bit cells is coupled to the second electrode.

14. The MRAM bit cell circuit of claim 1, wherein:
the common electrode comprises second electrodes of the plurality of MRAM bit cells;
the first write operation transistor is coupled to the first end portion of the common electrode such that the write current flowing through the first write operation transistor flows through each of the second electrodes of the common electrode;
the second write operation transistor is coupled to the second end portion of the common electrode such that the write current flowing through the second write operation transistor flows through each of the second electrodes of the common electrode; and
each access transistor of the plurality of MRAM bit cells is coupled to the first electrode.

15. The MRAM bit cell circuit of claim 1, further comprising:
a reference MRAM bit cell, comprising:
a first electrode and a second electrode;
a reference MTJ device, comprising:
a tunnel barrier between the first electrode and the second electrode;
a pinned layer between the tunnel barrier and the second electrode;
a free layer between the tunnel barrier and the first electrode; and
a reference access transistor coupled to one of the first electrode or the second electrode of the reference MTJ device, the reference access transistor comprising:
a gate coupled to a word line (WL);
a drain coupled to the one of the first electrode or the second electrode of the reference MTJ device; and
a source configured to be coupled to the source line (SL);
the reference access transistor configured to apply a source voltage applied to a reference source line (SL) to the one of the first electrode or the second electrode of the reference MRAM bit cell in response to the gate being activated; and
a reference read operation transistor coupled to the respective first electrode or the second electrode of the reference MRAM bit cell;
wherein the reference read operation transistor, when activated, is configured to provide a dedicated read operation circuit path for the reference MRAM bit cell, separate from the common write operation circuit path.

16. The MRAM bit cell circuit of claim 1, wherein the MTJ device of each MRAM bit cell among the plurality of MRAM bit cells is a perpendicular MTJ (pMTJ) device.

17. The MRAM bit cell circuit of claim 1, wherein the MTJ device of each MRAM bit cell among the plurality of MRAM bit cells is an in-plane MTJ (iMTJ) device.

18. The MRAM bit cell circuit of claim 1 integrated into an integrated circuit (IC).

19. The MRAM bit cell circuit of claim 1 integrated into a system-on-a-chip (SoC).

20. The MRAM bit cell circuit of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

21. A method of performing an access operation to a magneto-resistive random access memory (MRAM) bit cell among a plurality of MRAM bit cells in an MRAM bit cell circuit, comprising, in response to a read operation to an MRAM bit cell among the plurality of MRAM bit cells:
controlling a first write operation transistor coupled to a first end portion of a common electrode of the plurality of MRAM bit cells to present an impedance to the common electrode to decouple the first write operation transistor from the common electrode;
controlling a second write operation transistor coupled to a second end portion of the common electrode of the plurality of MRAM bit cells to present a high impedance to the common electrode to decouple the second write operation transistor from the common electrode; and
activating an access transistor coupled between a source line and the MRAM bit cell to be read to couple a source voltage to the MRAM bit cell and activating a read operation transistor coupled between a bit line (BL), the common electrode, and the MRAM bit cell to be read, to create a read operation circuit path between the source line (SL) and the bit line (BL), to cause a read current to flow between the source line (SL) and the bit line (BL).

22. The method of claim 21, further comprising, in response to the read operation:
activating the access transistor coupled between the source line (SL) and a reference MRAM bit cell to couple the source voltage to the reference MRAM bit cell and activating a reference read operation transistor coupled between a reference bit line and the reference MRAM bit cell, to create a reference read operation circuit path between a reference source line (SL) and a reference bit line (BL), to cause a reference read current to flow between the reference source line (SL) and the reference bit line (BL).

23. The method of claim 22, further comprising, in response to the read operation:

sensing the read current flowing between the source line (SL) and the bit line (BL) of the MRAM bit cell to be read;

sensing the reference read current flowing between the reference source line (SL) and the reference bit line (BL) of the MRAM bit cell; and determining a storage stage of the MRAM bit cell to be read based on a difference between the read current and the reference read current.

24. The method of claim 21, further comprising, in response to a write operation to the MRAM bit cell:

controlling a plurality of read operation transistors coupled to the plurality of MRAM bit cells to present an impedance to the common electrode to decouple the plurality of read operation transistors from the common electrode;

controlling access transistors of the plurality of MRAM bit cells to apply the source voltage to the plurality of MRAM bit cells; and driving a positive source voltage on a source of a first write operation transistor coupled to the first end portion of the common electrode and driving a negative or zero source voltage on a source of a second write operation transistor coupled to the second end portion of the common electrode to create a common write operation circuit path through the common electrode to cause a write current to flow through the common electrode to create a spin torque in a first direction on the plurality of MRAM bit cells in the write operation.

25. The method of claim 21, wherein:

the plurality of MRAM bit cells each comprise:
 a first electrode and a second electrode; and
 a magnetic tunnel junction (MTJ) device, comprising:
  a tunnel barrier between the first electrode and the second electrode;
  a pinned layer between the tunnel barrier and the second electrode; and
  a free layer between the tunnel barrier and the first electrode;
the access transistor coupled to one of the first electrode or the second electrode; and
the common electrode comprising either the first electrodes or the second electrodes of the plurality of MRAM bit cells.

26. A magneto-resistive random access memory (MRAM), comprising:

a plurality of MRAM bit cell rows each comprising an MRAM bit cell circuit, comprising:
 a plurality of MRAM bit cells each comprising:
  a first electrode and a second electrode;
  a magnetic tunnel junction (MTJ) device, comprising:
   a tunnel barrier between the first electrode and the second electrode;
   a pinned layer between the tunnel barrier and the second electrode; and
   a free layer between the tunnel barrier and the first electrode; and
  an access transistor coupled between one of the first electrode or the second electrode and a source line (SL);
 a common electrode comprising either the first electrodes or the second electrodes of the plurality of MRAM bit cells, the common electrode comprising a first end portion and a second end portion;
 a first write operation transistor coupled to the first end portion of the common electrode such that a write current flowing through the first write operation transistor flows through each of the first electrodes or the second electrodes of the common electrode, the first write operation transistor comprising a first write enable input coupled to a write enable line;
 a second write operation transistor coupled to the second end portion of the common electrode such that a write current flowing through the second write operation transistor flows through each of the first electrodes or the second electrodes of the common electrode, the second write operation transistor comprising a second write enable input coupled to the write enable line;
 the first write operation transistor and the second write operation transistor, when activated, configured to provide a common write operation circuit path through the common electrode for the plurality of MRAM bit cells; and
 a plurality of read operation transistors each coupled to a respective first electrode or second electrode of an MRAM bit cell among the plurality of MRAM bit cells;
 each read operation transistor among the plurality of read operation transistors, when activated, configured to provide a dedicated read operation circuit path for its respective MRAM bit cell, separate from the common write operation circuit path;
a bit line (BL) column selector circuit, comprising:
 the plurality of read operation transistors for the plurality of MRAM bit cells;
 a plurality of dedicated bit lines (BL) coupled to respective sources of the plurality of read operation transistors;
 a read enable input coupled to a read enable line; and
 a memory address input configured to receive a memory address for a read operation; and
a source line (SL) column selector circuit, comprising:
 a plurality of source line (SL) transistors each coupled between a voltage source to a source line (SL) of an access transistor among the plurality of MRAM bit cells;
 a read enable input coupled to a read enable line;
 a write enable input coupled to a write enable line; and
 a memory address input configured to receive a memory address for an access operation.

27. The MRAM of claim 26, wherein, in response to a read enable signal indicating a read enable state asserted on the read enable line in response to a read operation:

the bit line (BL) column selector circuit is configured to activate a read operation transistor among the plurality of read operation transistors to couple a respective dedicated bit line (BL) among the plurality of dedicated bit lines (BL) to a source of an activated read operation transistor of an MRAM bit cell among the plurality of MRAM bit cells, to create a read operation circuit path between the MRAM bit cell coupled to the read operation transistor and the respective dedicated bit line (BL) based on the received memory address, in response to a read enable signal in the read enable state asserted on the read enable input of the bit line (BL) column selector circuit; and the source line (SL) column selector circuit is configured activate a source line (SL) transistor among the plurality of source line (SL) transistors to couple a respective dedicated source line (SL) among the plurality of source lines (SL) to a source of an activated access transistor of an MRAM bit cell among the plurality of MRAM bit cells, in response to the read enable signal in the read enable state asserted on the read enable input of the source line (SL) column selector circuit.

28. The MRAM of claim 27, wherein, in response to a write enable signal indicating a write enable state asserted on a write enable line in response to a write operation:
   the first write operation transistor is configured to present an impedance to the common electrode to decouple the first write operation transistor from the common electrode; and
   the second write operation transistor is configured to present a high impedance to the common electrode to decouple the second write operation transistor from the common electrode.

29. The MRAM of claim 26, wherein, in response to a write enable signal indicating a write enable state asserted on a write enable line in response to a write operation:
   the first write operation transistor is configured to be activated to couple the first end portion of the common electrode to a first source to drive a positive source voltage from the first source to the first end portion of the common electrode and the second write operation transistor configured to be activated to couple the second end portion of the common electrode to drive a negative or zero source voltage to the second end portion of the common electrode to a second source to drive a negative or zero source voltage from the second source to the second end portion of the common electrode to create a common write operation circuit path through the common electrode to cause a write current to flow through the common electrode to create a spin torque in a first direction on the plurality of MRAM bit cells; and
   the source line (SL) column selector circuit is configured to activate a source line (SL) transistor among the plurality of source line (SL) transistors to couple a respective dedicated source line (SL) among the plurality of source lines (SL) to a source of an activated access transistor of an MRAM bit cell among the plurality of MRAM bit cells, in response to the write enable signal in the write enable state asserted on the write enable input of the source line (SL) column selector circuit.

30. The MRAM of claim 29, wherein, in response to the read enable signal indicating a read enable state asserted on the read enable line in response to the write operation, the bit line (BL) column selector circuit is configured to deactivate the plurality of read operation transistors to decouple the plurality of dedicated bit lines (BL) to the sources of the plurality of MRAM bit cells.

* * * * *